(12) United States Patent
Braithwaite et al.

(10) Patent No.: US 7,709,828 B2
(45) Date of Patent: *May 4, 2010

(54) RF CIRCUITS INCLUDING TRANSISTORS HAVING STRAINED MATERIAL LAYERS

(75) Inventors: Glyn Braithwaite, Whitley Bay (GB); Richard Hammond, Cardiff (GB); Matthew Currie, Brookline, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 639 days.

This patent is subject to a terminal disclaimer.

(21) Appl. No.: 11/032,413

(22) Filed: Jan. 10, 2005

(65) Prior Publication Data

US 2005/0116219 A1    Jun. 2, 2005

Related U.S. Application Data

(63) Continuation of application No. 10/253,361, filed on Sep. 24, 2002, now Pat. No. 6,933,518.

(51) Int. Cl.
H01L 31/00    (2006.01)

(52) U.S. Cl. .................. 257/24; 257/219; 257/E29.012

(58) Field of Classification Search .................... 257/24
See application file for complete search history.

(56) References Cited

U.S. PATENT DOCUMENTS

| | | | |
|---|---|---|---|
| 4,010,045 A | 3/1977 | Ruehrwein | |
| 4,710,788 A | 12/1987 | Dämbkes et al. | |
| 4,849,370 A | 7/1989 | Spratt et al. | |
| 4,987,462 A | 1/1991 | Kim et al. | |
| 4,990,979 A | 2/1991 | Otto | |
| 4,997,776 A | 3/1991 | Harame et al. | |
| 5,013,681 A | 5/1991 | Godbey et al. | |
| 5,089,872 A | 2/1992 | Ozturk et al. | |
| 5,155,571 A | 10/1992 | Wang et al. | |
| 5,166,084 A | 11/1992 | Pfiester | |
| 5,177,583 A | 1/1993 | Endo et al. | |
| 5,202,284 A | 4/1993 | Kamins et al. | |

(Continued)

FOREIGN PATENT DOCUMENTS

DE    41 01 167    7/1992

(Continued)

OTHER PUBLICATIONS

Armstrong et al., "Design of Si/SiGe Heterojunction Complementary Metal-Oxide-Semiconductor Transistors," IEDM Technical Digest (1995 International Electron Devices Meeting) pp. 761-764.

(Continued)

*Primary Examiner*—Sue Purvis
*Assistant Examiner*—Benjamin P Sandvik
(74) *Attorney, Agent, or Firm*—Slater & Matsil, L.L.P.

(57) ABSTRACT

Circuits for processing radio frequency ("RF") and microwave signals are fabricated using field effect transistors ("FETs") that have one or more strained channel layers disposed on one or more planarized substrate layers. FETs having such a configuration exhibit improved values for, for example, transconductance and noise figure. RF circuits such as, for example, voltage controlled oscillators ("VCOs"), low noise amplifiers ("LNAs"), and phase locked loops ("PLLs") built using these FETs also exhibit enhanced performance.

19 Claims, 7 Drawing Sheets

U.S. PATENT DOCUMENTS

| | | | |
|---|---|---|---|
| 5,207,864 A | 5/1993 | Bhat et al. | |
| 5,208,182 A | 5/1993 | Narayan et al. | |
| 5,212,110 A | 5/1993 | Pfiester et al. | |
| 5,221,413 A | 6/1993 | Brasen et al. | |
| 5,241,197 A | 8/1993 | Murakami et al. | |
| 5,242,847 A | 9/1993 | Ozturk et al. | |
| 5,250,445 A | 10/1993 | Bean et al. | |
| 5,283,456 A | 2/1994 | Hsieh et al. | |
| 5,285,086 A | 2/1994 | Fitzgerald | |
| 5,291,439 A | 3/1994 | Kauffmann et al. | |
| 5,298,452 A | 3/1994 | Meyerson | |
| 5,310,451 A | 5/1994 | Tejwani et al. | |
| 5,313,083 A * | 5/1994 | Schindler | 257/280 |
| 5,316,958 A | 5/1994 | Meyerson | |
| 5,340,759 A | 8/1994 | Hsieh et al. | |
| 5,346,848 A | 9/1994 | Grupen-Shemansky et al. | |
| 5,374,564 A | 12/1994 | Bruel | |
| 5,399,522 A | 3/1995 | Ohori | |
| 5,413,679 A | 5/1995 | Godbey et al. | |
| 5,426,069 A | 6/1995 | Selvakumar et al. | |
| 5,426,316 A | 6/1995 | Mohammad | |
| 5,442,205 A | 8/1995 | Brasen et al. | |
| 5,461,243 A | 10/1995 | Ek et al. | |
| 5,461,250 A | 10/1995 | Burghartz et al. | |
| 5,462,883 A | 10/1995 | Dennard et al. | |
| 5,476,813 A | 12/1995 | Naruse | |
| 5,479,033 A | 12/1995 | Baca et al. | |
| 5,484,664 A | 1/1996 | Kitahara et al. | |
| 5,495,115 A | 2/1996 | Kudo et al. | |
| 5,516,721 A | 5/1996 | Galli et al. | |
| 5,523,243 A | 6/1996 | Mohammad | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,540,785 A | 7/1996 | Dennard et al. | |
| 5,561,302 A * | 10/1996 | Candelaria | 257/24 |
| 5,596,527 A | 1/1997 | Tomioka et al. | |
| 5,617,351 A | 4/1997 | Bertin et al. | |
| 5,630,905 A | 5/1997 | Lynch et al. | |
| 5,633,202 A | 5/1997 | Brigham et al. | |
| 5,659,187 A | 8/1997 | Legoues et al. | |
| 5,683,934 A | 11/1997 | Candelaria | |
| 5,698,869 A | 12/1997 | Yoshimi et al. | |
| 5,710,450 A | 1/1998 | Chau et al. | |
| 5,714,777 A | 2/1998 | Ismail et al. | |
| 5,728,623 A | 3/1998 | Mori | |
| 5,739,567 A | 4/1998 | Wong | |
| 5,759,898 A | 6/1998 | Ek et al. | |
| 5,777,347 A | 7/1998 | Bartelink | |
| 5,777,364 A * | 7/1998 | Crabbe et al. | 257/347 |
| 5,786,612 A | 7/1998 | Otani et al. | |
| 5,786,614 A | 7/1998 | Otani et al. | |
| 5,792,679 A | 8/1998 | Nakato | |
| 5,808,344 A | 9/1998 | Ismail et al. | |
| 5,847,419 A | 12/1998 | Imai et al. | |
| 5,874,329 A * | 2/1999 | Neary et al. | 438/203 |
| 5,877,070 A | 3/1999 | Goesele et al. | |
| 5,891,769 A * | 4/1999 | Liaw et al. | 438/167 |
| 5,906,708 A | 5/1999 | Robinson et al. | |
| 5,906,951 A | 5/1999 | Chu et al. | |
| 5,912,479 A | 6/1999 | Mori et al. | |
| 5,943,560 A | 8/1999 | Chang et al. | |
| 5,963,817 A | 10/1999 | Chu et al. | |
| 5,966,622 A | 10/1999 | Levine et al. | |
| 5,976,939 A | 11/1999 | Thompson et al. | |
| 5,998,807 A | 12/1999 | Lustig et al. | |
| 6,013,134 A | 1/2000 | Chu et al. | |
| 6,033,974 A | 3/2000 | Henley et al. | |
| 6,033,995 A | 3/2000 | Muller | |
| 6,051,482 A | 4/2000 | Yang et al. | |
| 6,058,044 A | 5/2000 | Sugiura et al. | |
| 6,059,895 A | 5/2000 | Chu et al. | |
| 6,074,919 A | 6/2000 | Gardner et al. | |
| 6,096,590 A | 8/2000 | Chan et al. | |
| 6,103,559 A | 8/2000 | Gardner et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,133,799 A | 10/2000 | Favors, Jr. et al. | |
| 6,140,687 A | 10/2000 | Shimomura et al. | |
| 6,143,636 A | 11/2000 | Forbes et al. | |
| 6,153,495 A | 11/2000 | Kub et al. | |
| 6,154,475 A | 11/2000 | Soref et al. | |
| 6,160,303 A | 12/2000 | Fattaruso | |
| 6,162,688 A | 12/2000 | Gardner et al. | |
| 6,180,978 B1 | 1/2001 | Chatterjee et al. | |
| 6,184,111 B1 | 2/2001 | Henley et al. | |
| 6,191,007 B1 | 2/2001 | Matsui et al. | |
| 6,191,432 B1 | 2/2001 | Sugiyama et al. | |
| 6,194,722 B1 | 2/2001 | Fiorini et al. | |
| 6,204,529 B1 | 3/2001 | Lung et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,228,694 B1 | 5/2001 | Doyle et al. | |
| 6,232,138 B1 | 5/2001 | Fitzgerald et al. | |
| 6,235,567 B1 | 5/2001 | Huang | |
| 6,235,568 B1 | 5/2001 | Murthy et al. | |
| 6,242,324 B1 | 6/2001 | Kub et al. | |
| 6,249,022 B1 | 6/2001 | Lin et al. | |
| 6,251,755 B1 | 6/2001 | Furukawa et al. | |
| 6,261,929 B1 | 7/2001 | Gehrke et al. | |
| 6,266,278 B1 | 7/2001 | Harari et al. | |
| 6,271,551 B1 | 8/2001 | Schmitz et al. | |
| 6,271,726 B1 | 8/2001 | Fransis et al. | |
| 6,281,532 B1 | 8/2001 | Doyle et al. | |
| 6,291,321 B1 | 9/2001 | Fitzgerald | |
| 6,313,016 B1 | 11/2001 | Kibbel et al. | |
| 6,316,301 B1 | 11/2001 | Kant | |
| 6,323,108 B1 | 11/2001 | Kub et al. | |
| 6,326,664 B1 | 12/2001 | Chau et al. | |
| 6,326,667 B1 | 12/2001 | Sugiyama et al. | |
| 6,329,063 B2 | 12/2001 | Lo et al. | |
| 6,335,546 B1 | 1/2002 | Tsuda et al. | |
| 6,339,232 B1 | 1/2002 | Takagi | |
| 6,350,993 B1 | 2/2002 | Chu et al. | |
| 6,368,733 B1 | 4/2002 | Nishinaga | |
| 6,368,925 B2 | 4/2002 | Weon et al. | |
| 6,368,946 B1 | 4/2002 | Dekker et al. | |
| 6,372,356 B1 | 4/2002 | Thornton et al. | |
| 6,380,013 B2 | 4/2002 | Lee et al. | |
| 6,399,970 B2 | 6/2002 | Kubo et al. | |
| 6,403,975 B1 | 6/2002 | Brunner et al. | |
| 6,407,406 B1 | 6/2002 | Tezuka | |
| 6,425,951 B1 | 7/2002 | Chu et al. | |
| 6,429,061 B1 | 8/2002 | Rim | |
| 6,436,801 B1 | 8/2002 | Wilk et al. | |
| 6,455,377 B1 | 9/2002 | Zheng et al. | |
| 6,482,714 B1 | 11/2002 | Hieda et al. | |
| 6,483,156 B1 | 11/2002 | Adkisson et al. | |
| 6,492,694 B2 | 12/2002 | Noble et al. | |
| 6,521,041 B2 | 2/2003 | Wu et al. | |
| 6,555,839 B2 * | 4/2003 | Fitzgerald | 257/18 |
| 6,563,152 B2 | 5/2003 | Roberds et al. | |
| 6,583,015 B2 | 6/2003 | Fitzgerald et al. | |
| 6,605,498 B1 | 8/2003 | Murthy et al. | |
| 6,621,131 B2 | 9/2003 | Murthy et al. | |
| 6,657,223 B1 | 12/2003 | Wang et al. | |
| 6,674,149 B2 | 1/2004 | Ohnishi et al. | |
| 6,703,648 B1 | 3/2004 | Xiang et al. | |
| 6,743,684 B2 | 6/2004 | Liu | |
| 6,831,292 B2 | 12/2004 | Currie et al. | |
| 6,876,053 B1 | 4/2005 | Ma et al. | |

| | | | | | |
|---|---|---|---|---|---|
| 7,064,039 | B2 | 6/2006 | Liu | | |
| 7,141,477 | B2 * | 11/2006 | Noda ........................ 438/305 | | |
| 2001/0003269 | A1 | 6/2001 | Wu et al. | | |
| 2001/0003364 | A1 | 6/2001 | Sugawara et al. | | |
| 2002/0014003 | A1 | 2/2002 | Asai et al. | | |
| 2002/0024395 | A1 | 2/2002 | Akatsuka et al. | | |
| 2002/0038898 | A1 | 4/2002 | Sugiyama et al. | | |
| 2002/0043660 | A1 | 4/2002 | Yamazaki et al. | | |
| 2002/0052084 | A1 | 5/2002 | Fitzgerald | | |
| 2002/0063292 | A1 | 5/2002 | Armstrong et al. | | |
| 2002/0068393 | A1 | 6/2002 | Fitzgerald et al. | | |
| 2002/0072130 | A1 | 6/2002 | Cheng et al. | | |
| 2002/0096717 | A1 | 7/2002 | Chu et al. | | |
| 2002/0100942 | A1 | 8/2002 | Fitzgerald et al. | | |
| 2002/0109135 | A1 | 8/2002 | Murota et al. | | |
| 2002/0113294 | A1 | 8/2002 | Rhee et al. | | |
| 2002/0123167 | A1 | 9/2002 | Fitzgerald | | |
| 2002/0123183 | A1 | 9/2002 | Fitzgerald | | |
| 2002/0123197 | A1 | 9/2002 | Fitzgerald et al. | | |
| 2002/0125471 | A1 | 9/2002 | Fitzgerald et al. | | |
| 2002/0125497 | A1 | 9/2002 | Fitzgerald | | |
| 2002/0140031 | A1 | 10/2002 | Rim | | |
| 2002/0158311 | A1 | 10/2002 | Ohnishi et al. | | |
| 2002/0168864 | A1 | 11/2002 | Cheng et al. | | |
| 2002/0190284 | A1 | 12/2002 | Murthy et al. | | |
| 2003/0003679 | A1 | 1/2003 | Doyle et al. | | |
| 2003/0013323 | A1 | 1/2003 | Hammond et al. | | |
| 2003/0025131 | A1 | 2/2003 | Lee et al. | | |
| 2003/0057439 | A1 | 3/2003 | Fitzgerald | | |
| 2004/0007724 | A1 | 1/2004 | Murthy et al. | | |
| 2004/0014276 | A1 | 1/2004 | Murthy et al. | | |
| 2004/0070035 | A1 | 4/2004 | Murthy et al. | | |
| 2004/0084735 | A1 | 5/2004 | Murthy et al. | | |
| 2004/0119101 | A1 | 6/2004 | Schrom et al. | | |
| 2004/0142545 | A1 | 7/2004 | Ngo et al. | | |
| 2004/0173815 | A1 | 9/2004 | Yeo et al. | | |
| 2005/0054168 | A1 | 3/2005 | Currie et al. | | |
| 2007/0293003 | A1 | 12/2007 | Currie et al. | | |
| 2007/0293009 | A1 | 12/2007 | Currie et al. | | |

FOREIGN PATENT DOCUMENTS

| | | |
|---|---|---|
| DE | 100 11 054 | 9/2000 |
| EP | 0 514 018 A2 | 4/1992 |
| EP | 0 587 520 A1 | 3/1994 |
| EP | 0 683 522 | 11/1995 |
| EP | 0 828 296 A2 | 3/1998 |
| EP | 0 829 908 A2 | 3/1998 |
| EP | 0 829 908 A3 | 3/1998 |
| EP | 0 838 858 | 4/1998 |
| EP | 0 889 502 | 1/1999 |
| EP | 0 910 124 | 4/1999 |
| EP | 1 020 900 A2 | 7/2000 |
| EP | 1 174 928 | 1/2002 |
| FR | 2 701 599 | 9/1993 |
| GB | 2 342 777 A | 4/2000 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-094420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 00-021783 | 1/2000 |
| JP | 00-031491 | 1/2000 |
| JP | 2001-148473 | 5/2001 |
| JP | 01-319935 | 11/2001 |
| JP | 02-076334 | 3/2002 |
| JP | 02-164520 | 6/2002 |
| JP | 02-289533 | 10/2002 |
| WO | 98/59365 | 12/1998 |
| WO | 99/53539 | 10/1999 |
| WO | 00/48239 | 8/2000 |
| WO | 00/54338 | 9/2000 |
| WO | 01/22482 A1 | 3/2001 |
| WO | 01/54202 A1 | 7/2001 |
| WO | 01/93338 | 12/2001 |
| WO | 01/99169 A2 | 12/2001 |
| WO | 02/13262 A2 | 2/2002 |
| WO | 02/15244 A2 | 2/2002 |
| WO | 02/27783 A1 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 A1 | 10/2002 |

OTHER PUBLICATIONS

Armstrong, "Technology for SiGe Heterostructure-Based CMOS Devices", PhD Thesis, Massachusetts Institute of Technology, 1999, pp. 1-154.

Augusto et al., "Proposal for a New Process Flow for the Fabrication of Silicon-based Complementary MOD-MOSFETs without ion Implantation," Thin Solid Films, vol. 294, No. 1-2, pp. 254-258 (Feb. 15, 1997).

Barradas et al., "RBS analysis of MBE-grown SiGe/(001) Si heterostructures with thin, high Ge content SiGe channels for HMOS transistors," Modern Physics Letters B (2001) (abstract).

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999) pp. 205-210.

Bouillon et al., "Search for the optimal channel architecture for 0.18/0.12 μm bulk CMOS Experimental study," IEEE, (1996) pp. 21.2.1-21.2.4.

Bruel, "Silicon on Insulator Material Technology," Electronic Letters, vol. 13, No. 14 (Jul. 6, 1995) pp. 1201-1202.

Bruel et al., "® SMART CUT: A Promising New SOI Material Technology," Proceedings 1995 IEEE International SOI Conference (Oct. 1995) pp. 178-179.

Bufler et al., "Hole transport in strained $Si_{1-x}Ge_x$ alloys on $Si_{1-y}Ge_y$ substrates," Journal of Applied Physics, vol. 84, No. 10 (Nov. 15, 1998) pp. 5597-5602.

Burghartz et al., "Microwave Inductors and Capacitors in Standard Multilevel Interconnect Silicon Technology", IEEE Transactions on Microwave Theory and Techniques, vol. 44, No. 1, Jan. 1996, pp. 100-104.

Canaperi et al., "Preparation of a relaxed Si-Ge layer on an insulator in fabricating high-speed semiconductor devices with strained epitaxial films," International Business Machines Corporation, USA (2002) (abstract).

Carlin et al., "High Efficiency GaAs-on-Si Solar Cells with High Voc Using Graded GeSi Buffers," IEEE (2000) pp. 1006-1011.

Chang et al., "Selective Etching of SiGe/Si Heterostructures," Journal of the Electrochemical Society, No. 1 (Jan. 1991) pp. 202-204.

Cheng et al., "Electron Mobility Enhancement in Strained-Si n-MOSFETs Fabricated on SiGe-on-Insulator (SGOI) Substrates," IEEE Electron Device Letters, vol. 22, No. 7 (Jul. 2001) pp. 321-323.

Cheng et al., "Relaxed Silicon-Germanium on Insulator Substrate by Layer Transfer," Journal of Electronic Materials, vol. 30, No. 12 (2001) pp. L37-L39.

Cullis et al, "Growth ripples upon strained SiGe epitaxial layers on Si and misfit dislocation interactions," Journal of Vacuum Science and Technology A, vol. 12, No. 4 (Jul./Aug. 1994) pp. 1924-1931.

Currie et al., "Carrier mobilities and process stability of strained S in- and p-MOSFETs on SiGe virtual substrates," J. Vac. Sci. Technol. B., vol. 19, No. 6 (Nov./Dec. 2001) pp. 2268-2279.

Currie et al., "Controlling Threading Dislocation in Ge on Si Using Graded SiGe Layers and Chemical-Mechanical Polishing," vol. 72 No. 14, p. 1718-1720, Feb. 1998.

Currie, M.T.;"SiGe Virtual Substrate Engineering for Integration of III-V Materials, Microelectromechanical Systems, and Strained Silicon MOSFET's with Silicon," Dept. of Materials Science and Engineering in Partial Fulfillment of the Requirements for the Degree of Doctor of Philosophy in Electronic Materials at the Massachusetts Institute of Technology, Feb. 2001, pp. 158-162, 170-183.

Eaglesham et al., "Dislocation-Free Stranski-Krastanow Growth of Ge on Si(100)," Physical Review Letters, vol. 64, No. 16 (Apr. 16, 1990) pp. 1943-1946.

Feijoo et al., "Epitaxial Si-Ge Etch Stop Layers with Ethylene Diamine Pyrocatechol for Bonded and Etchback Silicon-on-Insulator," Journal of Electronic Materials, vol. 23, No. 6 (Jun. 1994) pp. 493-496.

Fischetti et al., "Band structure, deformation potentials, and carrier mobility in strained Si, Ge, and SiGe alloys," J. Appl. Phys., vol. 80, No. 4 (Aug. 15, 1996) pp. 2234-2252.

Fischetti, "Long-range Coulomb interactions in small Si devices. Part II. Effective electronumobility in thin-oxide structures," Journal of Applied Physics, vol. 89, No. 2 (Jan. 15, 2001) pp. 1232-1250.

Fitzgerald et al., "Dislocation dynamics in relaxed graded composition semiconductors," Materials Science and Engineering B67, (1999) pp. 53-61.

Fitzgerald et al., "Relaxed $Ge_xSi_{1-x}$ structures for III-V integration with Si and high mobility two-dimensional electron gases in Si," AT&T Bell Laboratories, Murray Hill, NJ 07974 (1992) American Vacuum Society, pp. 1807-1819.

Fitzgerald et al., "Totally Relaxed $Ge_xSi_{1-x}$ Layers with Low Threading Dislocation Densities Grown on Si Substrates," Applied Physics Letters, vol. 59, No. 7 (Aug. 12, 1991) pp. 811-813.

Garone et al., "Silicon vapor phase epitaxial growth catalysis by the presence of germane," Applied Physics Letters, vol. 56, No. 13 (Mar. 26, 1990) pp. 1275-1277.

Gray and Meyer, "Analysis and Design of Analog Integrated Circuits", John Wiley & Sons, 1984, pp. 605-632.

Grützmacher et al., "Ge segregation in SiGe/Si heterostructures and its dependence on deposition technique and growth atmosphere," Applied Physics Letters, vol. 63, No. 18 (Nov. 1, 1993) pp. 2531-2533.

Hackbarth et al., "Alternatives to thick MBE-grown relaxed SiGe buffers," Thin Solid Films, vol. 369, No. 1-2 (Jul. 2000) pp. 148-151.

Hackbarth et al., "Strain relieved SiGe buffers for Si-based heterostructure field-effect transistors," Journal of Crystal Growth, vol. 201/202 (1999) pp. 734-738.

Herzog et al., "SiGe-based FETs: buffer issues and device results," Thin Solid Films, vol. 380 (2000) pp. 36-41.

Höck et al., "Carrier mobilities in modulation doped $Si_{1-x}Ge_x$ heterostructures with respect to FET applications," Thin Solid Films, vol. 336 (1998) pp. 141-144.

Höck et al., "High hole mobility in $Si_{0.17}Ge_{0.83}$ channel metal-oxide-semiconductor field-effect transistors grown by plasma-enhanced chemical vapor deposition," Applied Physics Letters, vol. 76, No. 26 (Jun. 26, 2000) pp. 3920-3922.

Höck et al., "High Performance 0.25μm p-type Ge/SiGe MODFETs", Electronic Letters, vol. 34, No. 19, Sep. 17, 1998, pp. 1888-1889.

Huang et al., "High-quality strain-relaxed SiGe alloy grown on implanted silicon-on-insulator substrate," Applied Physics Letters, vol. 76, No. 19 (May 8, 2000) pp. 2680-2682.

Huang et al., "The Impact of Scaling Down to Deep Submicron on CMOS RF Circuits", IEEE Journal of Solid-State Circuits, vol. 33, No. 7, Jul. 1998, pp. 1023-1036.

IBM Technical Disclosure Bulletin, vol. 35, No. 4B (Sep. 1992), "2 Bit/Cell EEPROM Cell Using Band to Band Tunneling for Data Read-Out," pp. 136-140.

IBM Technical Disclosure Bulletin, vol. 32, No. 8A, Jan. 1990, "Optimal Growth Technique and Structure for Strain Relaxation of Si-Ge Layers on Si Substrates", pp. 330-331.

Ishikawa et al., "Creation of Si-Ge-based SIMOX structures by low energy oxygen implantation," Proceedings 1997 IEEE International SOI Conference (Oct. 1997) pp. 16-17.

Ishikawa et al., "SiGe-on-insulator substrate using SiGe alloy grown Si(001)," Applied Physics Letters, vol. 75, No. 7 (Aug. 16, 1999) pp. 983-985.

Ismail et al., "Modulation-doped n-type Si/SiGe with inverted interface," Appl. Phys. Lett., vol. 65, No. 10 (Sep. 5, 1994) pp. 1248-1250.

Ismail, "Si/SiGe High-Speed Field-Effect Transistors," Electron Devices Meeting, Washington, D.C. (Dec. 10, 1995) pp. 20.1.1-20.1.4.

Kearney et al., "The effect of alloy scattering on the mobility of holes in a $Si_{1-x}Ge_x$ quantum well," Semicond. Sci Technol., vol. 13 (1998) pp. 174-180.

Kim et al.,"A Fully Integrated 1.9-GHz CMOS Low-Noise Amplifier", IEEE Microwave and Guided Wave Letters, vol. 8, No. 8, Aug. 1998, pp. 293-295.

Koester et al., "Extremely High Transconductance $Ge/Si_{0.4}Ge_{0.6}$ p-MODFET's Grown by UHV-CVD," IEEE Electron Device Letters, vol. 21, No. 3 (Mar. 2000) pp. 110-112.

König et al., "Design Rules for n-Type SiGe Hetero FETs," Solid State Electronics, vol. 41, No. 10 (1997), pp. 1541-1547.

König et al., "p-Type Ge-Channel MODFET's with High Transconductance Grown on Si Substrates," IEEE Electron Device Letters, vol. 14, No. 4 (Apr. 1993) pp. 205-207.

König et al., "SiGe HBTs and HFETs," Solid-State Electronics, vol. 38, No. 9 (1995) pp. 1595-1602.

Kuznetsov et al., "Technology for high-performance n-channel SiGe modulation-doped field-effect transistors," J. Vac. Sci. Technol., B 13(6), pp. 2892-2896 (Nov./Dec. 1995).

Larson, "Integrated Circuit Technology Options for RFIC's—Present Status and Future Directions", IEEE Journal of Solid-State Circuits, vol. 33, No. 3, Mar. 1998, pp. 387-399.

Lee and Wong,"CMOS RF Integrated Circuits at 5 GHz and Beyond", Proceedings of the IEEE, vol. 88, No. 10, Oct. 2000, pp. 1560-1571.

Lee et al., "Strained Ge channel p-type metal-oxide-semiconductor field-effect transistors grown on $Si_{1-x}Ge_x/Si$ virtual substrates," Applied Physics Letters, vol. 79, No. 20 (Nov. 12, 2001) pp. 3344-3346.

Lee et al., "Strained Ge channel p-type MOSFETs fabricated on $Si_{1-x}Ge_x/Si$ virtual substrates," Mat. Res. Soc. Symp. Proc., vol. 686 (2002) pp. A1.9.1-A1.9.5.

Leitz et al., "Channel Engineering of SiGe-Based Heterostructures for High Mobility MOSFETs," Mat. Res. Soc. Symp. Proc., vol. 686 (2002) pp. A3.10.1-A3.10.6.

Leitz et al., "Dislocation glide and blocking kinetics in compositionally graded SiGe/Si," Journal of Applied Physics, vol. 90, No. 6 (Sep. 15, 2001) pp. 2730-2736.

Leitz et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," Applied Physics Letters, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," J. Vac. Sci. Technol, A vol. 20 No. 3 (May/Jun. 2002) pp. 1030-1033.

Lu et al., "High Performance 0.1 μm Gate-Length P-Type SiGe MODFET's and MOS-MODFET's", IEEE Transactions on Electron Devices, vol. 47, No. 8, Aug. 2000, pp. 1645-1652.

M. Kummer et al., "Low energy plasma enhanced chemical vapor deposition," Materials Science and Engineering B89 (2002) pp. 288-295.

Maiti et al., "Strained-Si heterostructure field effect transistors," Semicond. Sci. Technol., vol. 13 (1998) pp. 1225-1246.

Maszara, "Silicon-On-Insulator by Wafer Bonding: A Review," Journal of the Electrochemical Society, No. 1 (Jan. 1991) pp. 341-347.

Meyerson et al., "Cooperative Growth Phenomena in Silicon/Germanium Low-Temperature Epitaxy," Applied Physics Letters, vol. 53, No. 25 (Dec. 19, 1988) pp. 2555-2557.

Mizuno et al., "Advanced SOI-MOSFETs with Strained-SI Channel for High Speed CMOS-Electron/Hole Mobility Enhancement, " 2002 Symposium on VLSI Technology, Digest of Technical Papers, Honolulu, (Jun. 13-15), IEEE New York, NY, pp. 210-211.

Mizuno et al. "Electron and Hole Mobility Enhancement in Strained-Si MOSFET's on Si-Ge-on-Insulator Substrates Fabricated by SIMOX Technology"; IEEE Electron Device Letters, vol. 21, No. 5, May 2000, pp. 230-232.

Mizuno et al., "High Performance Strained-Si p-MOSFETs on SiGe-on-Insulator Substrates Fabricated by SIMOX Technology," IEEE IDEM Technical Digest, (1999 International Electron Device Meeting) pp. 934-936.

Monroe, D. et al..; "Comparison of mobility-limiting mechanisms in high-mobility $Si_{1-x}Ge_x$ heterostructures," J. Vac. Sci. Technol. B 11(4), Jul./Aug. 1993, pp. 1731-1737.

Nayak et al., "High-Mobility Strained-Si PMOSFET's"; IEEE Transactions on Electron Devices, vol. 43, No. 10, Oct. 1996, pp. 1709-1716.

O'Neill et al., "SiGe Virtual substrate N-channel heterojunction MOSFETS," Semicond. Sci. Technol., vol. 14 (1999) pp. 784-789.

Ota, Y. et al.; "Application of heterojunction FET to power amplifier for cellular telephone," Electronic Letters, IEEE Stevanage, GB, vol. 30 No. 11, May 26, 1994, pp. 906-907.

Papananos, "Radio-Frequency Microelectronic Circuits for Telecommunication Applications", Kluwer Academic Publishers, 1999, pp. 115-117, 188-193.

Parker et al., "SiGe heterostructure CMOS circuits and applications," Solid State Electronics, vol. 43 (1999) pp. 1497-1506.

Ransom et al., "Gate-Self-Aligned n-channel and p-channel Germanium MOSFET's," IEEE Transactions on Electron Devices, vol. 38, No. 12 (Dec. 1991) pp. 2695.

Reinking et al., "Fabrication of high-mobility Ge p-channel MOSFETs on Si substrates," Electronics Letters, vol. 35, No. 6 (Mar. 18, 1999) pp. 503-504.

Rim, "Application of Silicon-Based Heterostructures to Enhanced Mobility Metal-Oxide-Semiconductor Field-Effect Transistors", PhD Thesis, Stanford University, 1999; pp. 1-184.

Rim et al., "Enhanced Hole Mobilities in Surface-channel Strained-Si p-MOSFETs"; IEDM, 1995, pp. 517-520.

Rim et al., "Fabrication and Analysis of Deep Submicron Strained-Si N-MOSFET's"; IEEE Transactions on Electron Devices, vol. 47, No. 7, Jul. 2000, pp. 1406-1415.

Robbins et al., "A model for heterogeneous growth of $Si1-xGex$ films for hydrides," Journal of Applied Physics, vol. 69, No. 6 (Mar. 15, 1991) pp. 3729-3732.

Sadek et al., "Design of Si/SiGe Heterojunction Complementary Metal-Oxide-Semiconductor Transistors," IEEE Trans. Electron Devices (Aug. 1996) pp. 1224-1232.

Schäffler, "High-Mobility Si and Ge Structures," Semiconductor Science and Technology, vol. 12 (1997) pp. 1515-1549.

Sugimoto and Ueno, "A 2V, 500 MHz and 3V, 920 MHz Low-Power Current-Mode 0.6 µm CMOS VCO Circuit", IEICE Trans. Electron., vol. E82-C, No. 7, Jul. 1999, pp. 1327-1329.

Ternent et al.,"Metal Gate Strained Silicon MOSFETs for Microwave Integrated Circuits", IEEE Oct. 2000, pp. 38-43.

Tweet et al., "Factors determining the composition of strained GeSi layers grown with disilane and germane," Applied Physics Letters, vol. 65, No. 20 (Nov. 14, 1994) pp. 2579-2581.

Usami et al., "Spectroscopic study of Si-based quantum wells with neighboring confinement structure," Semicon. Sci. Technol. (1997) (abstract).

Welser et al., "Electron Mobility Enhancement in Strained-Si N-Type Metal-Oxide-Semiconductor Field-Effect Transistors," IEEE Electron Device Letters, vol. 15, No. 3 (Mar. 1994) pp. 100-102.

Welser et al., "Evidence of Real-Space Hot-Electron Transfer in High Mobility, Strained-Si Multilayer MOSFETs," IEEE IDEM Technical Digest (1993 International Electron Devices Meeting) pp. 545-548.

Welser et al., "NMOS and PMOS Transistors Fabricated in Strained Silicon/Relaxed Silicon-Germanium Structures," IEEE IDEM Technical Digest (1992 International Electron Devices Meeting) pp. 1000-1002.

Welser et al., "The Application of Strained Silicon / Relaxed Silicon Germanium Heterostructures to Metal-Oxide-Semiconductor Field-Effect Transistors," PhD Thesis, Stanford University, 1994, pp. 1-205.

Wolf and Tauber, Silicon Processing for the VLSI Era, vol. 1: Process Technology, Lattice Press, Sunset Beach, CA, pp. 384-386 (1986).

Xie et al., "Semiconductor Surface Roughness: Dependence on Sign and Magnitude of Bulk Strain," The Physical Review Letters, vol. 73, No. 22 (Nov. 28, 1994) pp. 3006-3009.

Xie, "SiGe Field effect transistors," Materials Science and Engineering, vol. 25 (1999) pp. 89-121.

Xie et al., "Very high mobility two-dimensional hole gas in Si/GexSi1-x/Ge structures grown by molecular beam epitaxy," Appl. Phys. Lett., vol. 63, No. 16 (Oct. 18, 1993) pp. 2263-2264.

Yeo et al., "Nanoscale Ultra-Thin-Body Silicon-on-Insulator P-MOSFET with a SiGe/Si Heterostructure Channel," IEEE Electron Device Letters, vol. 21, No. 4 (Apr. 2000) pp. 161-163.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

Internationa Search Report for Int'l Application No. PCT/US01/46322, mailed Jan. 22, 2003 (ASC-048).

Abiko et al., "A Channel Engineering Combined with Channel Epitaxy Optimization and TED Suppression for 0.15 µm n-n Gate CMOS Technology," 1995 Symposium on VLSI Technology Digest of Technical Papers, Apr. 1995, pp. 23-24.

Abstreiter et al., "Silicon/Germanium Strained Layer Superlattices," 95 J. Crystal Growth 431 (1989).

Abstreiter et al., "Strain-Induced Two-Dimensional Electron Gas in Selectively Doped Si1-x Gex Superlattices," 54 Physical Rev. Letters 2441 (1985).

Ahn et al., "Film Stress-related Vacancy Supersaturation in Silicon Under Low-pressure Chemical Vapor Deposited Silicon Nitride Films," 64 J. App. Physics 4914 (1988).

AmberWave Systems Corporation's Second Supplemental Responses to Intel's First Set of Interrogatories, U.S.D.C., District of Delaware, C.A. No. 05-301-KAJ (consolidated) (Jul. 12, 2006).

AmberWave Systems Corporation's Second Supplemental Response to Intel's Interrogatory No. 9, U.S.D.C., District of Delaware, C.A. No. 05-301-KAJ (consolidated) (Jul. 12, 2006).

Antonelli, et al., "Pressure and Strain Effects on Diffusion," 163 Mat. Research Soc'y Symp. Proceedings 523 (1990).

Arafa et al., "DC and RF Performance of 0.25 µm p-Type SiGe MODFET," 17 IEEE Electron Device Letters 449 (1996).

Arafa et al., "High Speed P-Type SiGe Modulation-Doped Field-Effect Transistors," 17 IEEE Electron Device Letters 124 (1996).

Arafa et al., "High-transconductance p-Type SiGe Modulation-doped Field?effect Transistor," 31 Electronics Letters 680 (1995).

Balk, "Surface Properties of Oxidized Germanium-Doped Silicon," 118 J. Electrochemical Soc'y: Solid State Science 494 (1971).

Bean et al, $Ge_{x1} Si_{1-x}$/Si Strained-layer Superlattice Grown by Molecular Beam Epitaxy, 2 J. Vacuum Sci. & Tech. 436 (1984).

Bean, "Silicon-Based Semiconductor Heterostructures: col. IV Bandgap Engineering," 80 Proceedings of the IEEE 571 (1992).

Bennett et al., "SIMS Depth Profiling of B and As Implants in $Si_{1-x} Ge_x$, and Strained $Si_{1-x} Ge_x$," Jul. 2004 Electrochemical Soc'y Proceedings 239 (2004).

Bera et al., "Analysis of Carrier Generation Lifetime in Strained-Si/SiGe Heterojunction MOSFETs from Capacitance Transient," 224 Applied Surface Sci. 278 (2004).

Bera et al., "Investigation of Electrical Properties of Furnace Grown Gate Oxide on Strained-Si," 462-63 Thin Solid Films 85 (2004).

Bohg, et al., "Influence of Film Stress and Thermal Oxidation on the Generation of Dislocations in Silicon," 33 Applied Physics Letters 895 (1978).

Boyanov et al., "Growth of Epitaxial CoSi2 on SiGe(001)," 86 J. App. Physics 1355 (1999).

Brantley, "Calculated Elastic Constants for Stress Problems Associated with Semiconductor Devices," 44 J. App. Physics 534 (1973).

Bullis, "Silicon Material Properties," in Handbook of Semiconductor Silicon Technology 423 (William C. O'Mara et al. eds., Noyes Publications 1990).

Bulsara, "Optical Interconnects Promised by III-V on-Silicon Integration," Solid State Technology 22 (Aug. 2004).

Bulsara, "SiGe Graded-Layer Technology Ready to be Incorporated into III-V Optical Interconnect Systems," 29 MRS Bulletin 611 (2004).

Butler et al., "MOS Fabrication Process Integrating Self-Aligned Polysilicon Gate and Post-Processed Metal Gate Devices on a Single Die," IEEE, Sep. 1991, pp. 199-203.

Cargill et al., "Lattice Compression from Conduction Electrons in Heavily Doped Si:As," 61 Physical Rev. Letters 1748 (1988).

Carns et al., "Chemical Etching of Si1-xGex, in HF: H2O2: CH3000H," 142 J. Electrochemical Soc'y 1260 (1995).

Cea, "Multidimensional Viscoelastic Modeling of Silicon Oxidation and Titanium Silicidation," (1996) (unpublished Ph.D. dissertation, University of Florida).

Cerdeira et al., "Raman Scattering from $Ge_xSi_{1-x}$/Si Strained-layer Superlattices," 45 Applied Physics Letters 1138 (1984).

Chang et al., "SALVO Process for Sub-50 nm Low-$V_T$ Replacement Gate CMOS with KrF Lithography," IEDM, Apr. 2000, pp. 53-56.

Chatterjee et al., "CMOS Metal Replacement Gate Transistors using Tantalum Pentoxide Gate Insulator," IEDM, Sep. 1998, pp. 777-780.

Chatterjee et al., "Sub-100nm Gate Length Metal Gate NMOS Transistors Fabricated by a Replacement Gate Process," IEDM, Jul. 1997, pp. 821-824.

Chen et al., "DC and RF Characterization of Fully Depleted Strained SOI MOSFETs," 2004 IEEE Int'l SOI Conf. Tech. Dig. 88 (2004).

Chidambarrao et al., "Stresses in Si Substrates Near Isolation Trenches," 70 J. App. Physics 4816 (1991).

Christodoulides et al., "The Recrystallization of Ion-implanted Silicon Layers II. Implant Species Effect," 36 Radiation Effects 73 (1978).

Chu, et al, "A Study of Residual Stress Distribution Through the Thickness of p+ Silicon Films," 40 IEEE Transactions on Electron Devices 1245 (1993).

Chun, et al., "Effective Mass and Mobility of Holes in Strained $Si_{1-x}Ge_x$ Layers on (001) Si1-yGey Substrate," 39 IEEE Transactions on Electron Devices 2153 (1992).

Comi et al., "Solid phase Epitaxial Growth of Ge-Si Alloys Made by Ion Implantation," 71 J. App. Physics 2644 (1992).

Cowem, et al., "A Model for Coupled Dopant Diffusion in Silicon," 6 Int'l J. Computation and Mathematics in Electrical and Electronic Engineering 59 (1987).

Cowem et al., "Diffusion in Strained Si(Ge)," 72 Physical Rev. Letters 2585 (1994).

Cowern et al., "Interdiffusion Mechanisms in Coherently Strained SiGe Multilayers," 96-4 Electrochemical Soc'y Proceedings 195 (1996).

Currie, "Strained Silicon: Engineered Substrates and Device Integration," 2004 Int'l Conf. on Integrated Circuit Design and Tech. 261 (2004).

Daembkes et al., "Fabrication and Properties of n-Channel SiGe/Si Modulation Doped Field-Effect Transistors Grown by MBE," 1985 Int'l Electron Device Meeting Tech. Dig. 768 (1985).

Davidson, et al., "Damage Produced by Ion Implantation in Silicon," in Ion implantation 51 (Fred H. Eisen & Lewis T. Chadderton eds., 1971).

De Wolf et al., "Process-induced Mechanical Stress in Isolation Structures Studied by Micro Raman Spectroscopy," 74 J. App. Physics 4490 (1993).

De Wolf, "Micro-Raman Spectroscopy to Study Local Mechanical Stress in Silicon Integrated Circuits," 11 Semiconductor Sci. Tech. 139 (1996).

De Wolf et al., "Stress Measurements in Silicon Devices Through Raman Spectroscopy: Bridging the Gap between Theory and Experiment," 79 J. App. Physics 7148 (1996).

Dellith et al., "A Dislocation Formation Model of Trench-Induced Dislocations in Dynamic Random Access Memories," 143 J. of the Electrochemical Soc'y 210 (1996).

Ding et al., "Residual Stress and Mechanical Properties of Boron-doped P+-Silicon Films," A21-23 Sensors and Actuators 866 (1990).

Doemer et al., "A Method for Interpreting the Data from Depth-sensing Indentation Instruments," 1 J. Mat. Research 601 (1986).

Dorda, "Piezoresistance in Quantized Conduction Bands in Silicon Inversion Layers," 42 J. App. Physics 2053 (1971).

Duffy et al., "Effects of High Phosphorus Concentration on Diffusion into Silicon," 115 J. Electrochemical Soc'y 84 (1968).

EerNisse, "Lateral Stress Measurements in ion-Implanted Metals and Insulators," in Ion Implantation in Semiconductors and Other Materials 531 (Billy L. Crowder ed., 1973).

Eichinger et al., "Characterization of MBE Grown SiGe Superlattices with SIMS and RBS," Proceedings of the First Int'l Symp. on Silicon Molecular Beam Epitaxy 367 (1985).

Erdtmann et al., "Structural Characterization of Strained Silicon Substrates by X-ray Diffraction and Reflectivity," Extended Abstracts of the 2003 Int'l Conf. on Solid State Devices and Materials 290 (2003).

European Patent Office Communication pursuant to Article 96(2) EPC for Application No. 02786360.4, Mar. 15, 2006 (4 pages).

Fahey et al., "Point Defects and Dopant Diffusion in Silicon," 61 Rev. Modern Physics 289 (1989).

Fahey et al., "Stress-induced Dislocations in Silicon Integrated Circuits," 36 IBM J. Research & Dev. 158 (1992).

Fair, "Concentration Profiles of Diffused Dopants in Silicon," in Impurity Doping Processes in Silicon 315 (1981).

Fair, "Quantified Conditions for Emitter-Misfit Dislocation Formation in Silicon," 125 J. Electrochemical Soc'y: Solid-state Sci. & Tech. 923 (1978).

Fair, "The Effect of Strain-induced Band-gap Narrowing on High Concentration Phosphorus Diffusion in Silicon," 50 J. App. Physics 860 (1979).

Fang et al., "Calculation of the Fractional Interstitial Component of Boron Diffusion and Segregation Coefficient of Boron in $Si_{0.8}Ge_{0.2}$," 68 Applied Physics Letters 791 (1996).

Fang et al., "Transport Properties of Electrons in Inverted Silicon Surfaces," 169 Physical Rev. 619 (1968).

Fathy et al., "Formation of Epitaxial Layers of Ge on Si Substrates by Ge Implantation and Oxidation," 51 Applied Physics Letters 1337 (1987).

Feenstra, et al., "Scattering from Strain Variations in High-Mobility Si/SiGe Heterostructures," 78 J. App. Physics 6091 (1995).

Fiorenza et al., "Film Thickness Constraints for Manufacturable Strained Silicon CMOS," 19 Semiconductor Sci. Tech. L4 (2004) (letter to the editor).

Fiorenza et al., "Investigation of Misfit Dislocation Leakage in Supercritical Strained Silicon MOSFETs," Proceedings of the 2004 IEEE International Reliability Physics Symp. 493 (2004).

Fitzgerald, "Dislocations in Strained-layer Epitaxy: Theory, Experiment, and Applications," 7 Material Sci. Rep. 87 (1991).

Fitzgerald, "GeSi/Si Nanostructures," 25 Annual Rev. of Materials Sci. 417 (1995).

Fitzgerald et al., "MOSFET Channel Engineering Using Strained Si, SiGe, and Ge Channels," Extended Abstracts of the 2002 Int'l Conf. on Solid State Devices and Materials 144 (2002).

Fitzgerald et al., "Silicon-Based Epitaxial Films for MEMS," 518 Mat. Res. Soc. Symp. Proc. 233 (1998).

Fitzgerald et al., "Strain-free $Ge_xSi_{1-x}$ Layers with Low Threading Dislocation Densities Grown on Si Substrates," 220 Mat. Resource Soc'y Symp. Proc. 211 (1991).

Frank et al., "Diffusion in Silicon and Germanium," in Diffusion in Crystalline Solids 63 (Graeme E. Murch & Arthur S. Nowick eds., 1984).

Frank, "The Interplay of Solute- and Self-diffusion—A key for Revealing Diffusion Mechanisms in Silicon and Germanium," 75 Defect and Diffusion F. 121 (1991).

Fukatsu et al., "SiGe-based Semiconductor-on-insulator Substrate Created by Low-energy Separation-by-implanted-oxygen," 72 Applied Physics Letters 3485 (1998).

Fukuhara, et al., "Determination of Strain Distributions from X-ray Bragg Reflexion by Silicon Single Crystals," 33 Acta Crystallographica Section A 137 (1977).

Gannavaram, et al., "Low Temperature ($\leq 800°$ C) Recessed Junction Selective Silicon-Germanium Source/Drain Technology for sub-70 nm CMOS," 2000 IEEE IEDM Tech. Dig., pp. 437-440.

Garone et al., "Mobility Enhancement and Quantum Mechanical Modeling in GeSi1-x Channel MOSFETs from 90 to 300 K," 1991 IEDM 29.

Gates et al., "Epitaxial Si Films on Ge(100) Grown via H/Cl Exchange," 62 Applied Physics Letters 510 (1993).

Ge et al., "Process-Strained Si (PSS) CMOS Technology Featuring 3D Strain Engineering," 2003 IEEE IEDM Tech. Dig., pp. 73-76.

Gerward, "Implantation-induced Strains in Silicon Studied by X-ray Interferometry and Topography," 37 Phil. Mag. A 95 (1978).

Ghani et al., "Effect of Oxygen on Minority-Carrier Lifetime and Recombination Currents in Si1-xGex, Heterostructure Devices, " 58 Applied Physics Letters 1317 (1991).

Ghani et al., "A 90nm High Volume Manufacturing Logic Technology Featuring Novel 45nm Gate Length Strained Silicon CMOS Transistors," 2003 IEEE IEDM Tech. Dig., pp. 978-980.

Ghoshtagore, "Donor Diffusion Dynamics in Silicon," 3 Physical Rev. B 397 (1971).

Ghoshtagore, "Dopant Diffusion in Silicon. III. Acceptors," 3 Physical Rev. B 2507 (1971).

Gibbon et al., "The Effect of Mask Edges on Dopant Diffusion into Semiconductors," 119 J. Electrochemical Soc'y: Solid-State Sci. & Tech. 767 (1972).

Gibbons et al, "Limited Reaction Processing: Silicon Epitaxy," 47 Applied Physics Letters 721 (1985).

Gilliard, et al., "Study of the Dislocation Processes Associated with Strain Relaxation in Si—Ge Heteroepitaxial Films," 84 Zeitschrift fur Metallkunde 874 (1993).

Glück et al., "High fmax n-Type Si/SiGe MODFETs," 33 Electronic Letters 335 (1997).

Godbey et al., "A $Si_{0.7}Ge_{0.3}$ Strained Layer Etch Stop for the Generation of Bond and Etch Back SOI," 1989 IEEE SOS/SOI Tech. Conf. Proceedings 143.

Goo et al., "Scalability of Strained-Si nMOSFETs Down to 25 nm Gate Length," 24 IEEE Electron Device Letters 351 (2003).

Goroff et al., "Deformation Potentials in Silicon. III. Effects of a General Strain on Conduction and Valence Levels," 132 Physical Rev. 1080 (1963).

Gronet, et al., "Growth of GeSi/Si strained-layer superlattices using limited reaction processing," 61 J. App. Physics 6, pp. 2407-2409 (Mar. 1987).

Hamada et al., "A New Aspect of Mechanical Stress Effects in Scaled MOS Devices," 38 IEEE Transactions on Electron Devices 4, pp. 895-900 (Apr. 1991).

Hargrove et al., "Quantum Mechanical Modeling of the Charge Distribution in a Si/Si1-xGex/Si P-Channel MOSFET," 1994 Int'l Electron Device Meeting Tech. Dig. 735 (1994).

Hensel, et al., "Cyclotron Resonance Experiments in Uniaxially Stressed Silicon: Valence Band Inverse Mass Parameters and Deformation Potentials," 129 Physical Rev. 1041 (1963).

Herbots et al., "Semiconductor-based Heterostructure Formation Using Low Energy Ion Beams: Ion Beam Deposition (IBD) & Combined Ion and Molecular Beam Deposition (CIMD)," in Deposition and Growth: Limits for Microelectronics 259 (G. W. Rugloff ed., American Vacuum Society 1988).

Hergenrother et al., "50nm Vertical Replacement-Gate (VRG) nMOSFETs with ALD $HfO_2$ and $Al_2O_3$ Gate Dielectrics," IEDM, Mar. 2001, pp. 51-54.

Hergenrother et al., "The Vertical Replacement-Gate (VRG) MOSFET: A 50nm Vertical MOSFET with Lithography-Independent Gate Length," IEDM, Sep. 1999, pp. 75-78.

Hobart et al., "Ultra-Cut: A Simple Technique for the Fabrication of SOI Substrates with Ultra-Thin (<5 nm) Silicon Films," Proceedings 1998 IEEE Int'l SOI Conf. 145.

Holland et al., "Novel Oxidation Process in Ge+-implanted Si and its Effect on Oxidation Kinetics," 51 Applied Physics Letters 520 (1987).

Hollander et al., "Reduction of Dislocation Density of MBE-Grown $Si_{1-x}Ge_x$ Layers on (100) Si by Rapid Thermal Annealing," 183 Thin Solid Films 157 (1989).

Horn, "Densitometric and Electrical Investigation of Boron in Silicon," 97 Physical Rev. 1521 (1955).

Houghton, "Strain Relaxation Kinetics in $Si_{1-x}Ge_x/Si$ Heterostructures," 70 J. App. Physics 2136 (1991).

Hu "Stress-related Problems in Silicon Technology," 70 J. App. Physics R53 (1991).

Huang et al., "SiGe-on-insulator prepared by wafer bonding and layer transfer for high-performance field-effect transistors," 78 Applied Physics Letters, pp. 1267-1269 (2001).

Huang et al., "Isolation Process Dependence of Channel Mobility in Thin-Film SOI Devices," 17 IEEE Electron Device Letters 6, pp. 291-293 (Jun. 1996).

Huang et al., "LOCOS-Induced Stress Effects on Thin-Film SOI Devices," 44 IEEE Transactions on Electron Devices 4, pp. 646-650 (1997).

Huang, et al., "Reduction of Source/Drain Series Resistance and Its Impact on Device Performance for PMOS Transistors with Raised $Si_{1-x}Ge_x$ Source/Drain," 21 IEEE Electron Device Letters 9, pp. 448-450 (2000).

Hull et al., "Dynamic Observations of Misfit Dislocations in Strained Layer Heterostructures," in Microscopy of Semiconducting Materials 497 (1991).

Hull et al., "Growth of $Ge_xSi_{1-x}$ Alloys on Si(110) Surfaces," 59 Applied Physics Letters 964 (1991).

Hull et al., "Improvement in Heteroepitaxial Film Quality by a Novel Substrate Patterning Geometry," 60 Applied Physics Letters 1468 (1992).

Hull et al., "Interfacial Structure and Stability in $Ge_xSi_{1-x}/Si$ Strained Layers," 37 Mat. Resources Soc'y Symp. Proc. 261 (1985).

Hull et al., "Interpretation of Dislocation Propagation Velocities in Strained $Ge_xSi_{1-x}/Si(100)$ Heterostruciures by the Diffusive Kink Pair Model," 70 J. App. Physics 2052 (1991).

Hull, et al., "Misfit Dislocations in Lattice-Mismatched Epitaxial Films," 17 Critical Rev. in Solid State and Mat. Sci. 507 (1992).

Hull et al., "A phenomenological Description of Strain Relaxation in $Ge_xSi_{1-x}/Si(100)$ Heterostructures," 66 J. App. Physics 5837 (1989).

Hull et al., "Stability of Semiconductor Strained-layer Superlattices," 48 Applied Physics Letters 56 (1986).

Hull et al., "Structure Imaging of Commensurate $Ge_xSi_{1-x}/Si$ (100) Interfaces and Superlattices," 46 Applied Physics Letters 179 (1985).

Hull et al., "Structural Studies of GeSi/Si Heterostructures," Proceedings of the First Int'l Symp. on Silicon Molecular Beam Epitaxy 376 (1985).

Hwang et al., "Performance of 70nm Strained-Silicon CMOS Devices,"2003 Symp. on VLSI Tech. Dig. of Tech. Papers 103.

Iida et al., "Thermal behavior of residual strain in silicon-on-insulator bonded wafer and effects on electron mobility," 43 Solid-State Electronics, pp. 1117-1120 (1999).

Intel's Second Amended Responses and Objections to AmberWave's First Set of Interrogatories, U.S.D.C., District of Delaware, C.A. No. 05-301-KAJ (consolidated) (Aug. 7, 2006).

Ismail, "Effect of Dislocations in Strained Si/SiGe on Electron Mobility," 14 J. Vacuum Sci. & Tech. B 2776 (1996).

Ismail et al., "Electron Transport Properties of Si/SiGe Heterostructures: Measurements and Device Implications," 63 Applied Physics Letters 660 (1993).

Ismail et al., "Extremely High Electron Mobility in Si/SiGe Modulation-doped Heterostructures," 66 Applied Physics Letters 1077 (1995).

Ismail et al., "Gated Hall Effect Measurements in High-Mobility n-Type Si/SiGe Modulation Doped Heterostructures," 66 Applied Physics Letters 842 (1995).

Ismail et al., "High Electron Mobility in Modulation-doped Si/SiGe," 58 Applied Physics Letters 2117 (1991).

Ismail et al., "High Hole Mobility in SiGe Alloys for Device Applications," 64 Applied Physics Letters 3124 (1994).

Ismail et al., "High-Transconductance n-Type Si/SiGe Modulation-Doped Field-Effect Transistors," 13 IEEE Electron Device Letters 229 (1992).

Ismail, "Identification of a Mobility-Limiting Scattering Mechanism in Modulation-Doped Si/SiGe Heterostructures," 73 Physical Rev. Letters 3447 (1994).

Ito et al., "Mechanical Stress Effect on Etch-Stop Nitride and its Impact on Deep Submicron Transistor Design," 2000 IEEE IEDM Tech. Dig., pp. 247-250.

Iyer, et al., "Thermal Relaxation of Pseudomorphic Si-Ge Superlattices by Enhanced Diffusion and Dislocation Multiplication," 65 J. App. Physics 4693 (1989).

Jackson et al., "Undoped SiGe Heterostructure Field Effect Transistors," 40 IEEE Transactions on Electron Devices 2104 (Nov. 1993).

Jain et al., "Structure, Properties and Applications of Gex/Si1-x a Strained Layers and Superlattices," 6 Semiconductor Sci. & Tech. 547 (1991).

Jesson et al., "Interplay between Evolving Surface Morphology, Atomic-scale Growth Modes, and Ordering during $Si_{1-x}Ge_x$ Epitaxy," 70 Physical Rev. Letters 2293 (1993).

John et al., "Strained Si n-Channel Metal-oxide-semiconductor Transistor on Relaxed $Si_{1-x}Ge_x$ Formed by Ion Implantation of Ge," 74 Applied. Physics Letters 2076 (1999).

Jones et al, "An Advanced Calibration Method for Modelling Oxidation and Mechanical Stress in Sub-Micron CMOS Isolation Structures," 1994 Int'l Electron Device Meeting Tech. Dig. 877 (1994).

Jorke et al., "Mobility Enhancement in Modulation Doped Si- $Si_{1-x}Ge_x$ Superlattice Grown by Molecular Beam Epitaxy," Proceedings of the First Int'l Symp. on Silicon Molecular Beam Epitaxy 352 (1985).

Joshi et al., "Diffusion-Induced Imperfections in Silicon," 112 J. Elecrochemical Soc'y 185 (1965).

Jung et al., "Effect of Thermal Processing on Mobility in Strained Si/Strained $Si_{1-y}Ge_y$, on Relaxed $Si_{1-y}Ge_y$, (x<y) Virtual Substrates," 84 Applied Physics Letters 3319 (2004).

Jung et al., "Implementation of Both High-Hole and Electron Mobility in Strained Si/Strained $Si_{1-y}Ge_y$, Relaxed $Si_{1-x}Ge_x$ (x<y) Virtual Substrate," 24 IEEE Electron Device Letters 460 (2003).

Kao et al., "Two-dimensional Thermal Oxidation of Silicon -II. Modeling Stress Effects in Wet Oxides," ED-35 IEEE Transactions on Electron Devices 25 (1988).

Karmanov et al., "Influence of Radiation Defects on Impurity Diffusion in Silicon," 11 Soviet Physics and Semiconductors 1096 (1978).

Kasper et al., "A One-Dimensional SiGe Superlattice Grown by UHV Epitaxy," 8 Applied Physics A: Mat. Sci. & Processing 199 (1975).

Kasper et al., "An Industrial Single slice Si-MBE Apparatus," 136 J. Electrochemical Soc'y 1154 (1989).

Kasper, "Growth and Properties of Si/SiGe Superlattices," 174 Surface Sci. 630 (1986).

Kasper et al., "Elastic Strain and Misfit Dislocation Density in $Si_{0.92}Ge_{0.08}$ Films on Silicon Substrates," 44 Thin Solid Films 357 (1977).

Kasper et al., "Stability of Strained-Layer Superlattices," in Strained-Layer Superlattices: Materials Sci. & Tech. 240 (Thomas P. Pearsall ed., Academic Press, Inc. 1991).

Kissinger et al., Stepwise Equilibrated Graded $Ge_xSi_{1-x}$ Buffer with Very Low Threading Dislocation Density on Si(001), 66 Applied Physics Letters 2083 (1995).

Klauk et al., "Thermal Stability of Undoped Strained Si Channel SiGe Heterostructures," 68 Applied Physics Letters 1975 (1996).

Kleinman, "Deformation Potentials in Silicon. I. Uniaxial Strain," 128 Physical Rev. 2614 (1962).

Kleinman, "Deformation Potentials in Silicon. II. Hydrostatic Strain and the Electron-Phonon Interaction," 130 Physical Rev. 2283 (1963).

Kloeck et al., "Mechanical Sensors," in Semiconductor Sensors 153 (1994).

Kohli et al., "Ultra-Shallow Junction Formation in Strained Si/Si1-xGex Using Flash Assist RTA," Jul. 2004 Electrochemical Soc'y Proceedings 1113 (2004).

König et al., "Enhancement Mode n-Channel Si/SiGe MODFET with High Intrinsic Transconductance," 28 Electronics Letters 160 (1992).

König et al., "N-Channel Si/SiGe MODFETs: Effects of Rapid Thermal Activation on the DC Performance," 14 IEEE Electron Device Letters 97 (1993).

König, et al., "p-Type SiGe Channel Modulation Doped Field-effect Transistors with Post-evaporation Patterned Submicrometre Schottky Gates," 29 Electronic Letters 486 (1993).

König et al., "Si/SiGe Modulation Doped Field-Effect Transistor with Two Electron Channels," 27 Electronics Letters 1405 (1991).

Kringhøj et al, "Diffusion of Sb in Strained and Relaxed Si and SiGe," 76 Physical Rev. Letters 3372 (1996).

Kuo et al., "Boron Diffusion in Si and $Si_{1-x}Ge_x$," 379 Mat. Research Symp. Proc. 373 (1995).

Kuo et al., "Comparison of Boron Diffusion in Si and Strained $Si_{1-x}Ge_x$ Epitaxial Layers," 62 Applied Physics Letters 612 (1993).

Kuo et al., "Effects of Si Thermal Oxidation on B Diffusion in Si and Strained $Si_{1-x}Ge_x$ Layers," 67 Applied Physics Letters 706 (1995).

Kuo, "Effects of Strain on Boron Diffusion in Si and $Si_{1-x}Ge_x$," 66 Applied Physics Letters 580 (1995).

Kuroi et al., "Stress Analysis of Shallow Trench Isolation for 256MDRAM and Beyond," 1998 IEDM-Tech. Dig. 141.

Laikhtman et al., "Theoretical Hole Mobility in a Narrow Si/SiGe Quantum Well," 47 Physical Rev. B 515 (1993).

Lander et al., "On the Low-temperature Mobility of Holes in Gated Oxide Si/SiGe Heterostructures," 12 Semiconductor Sci. & Tech. 1064 (1997).

Langdo et al. "Strained Si on Insulator Technology: From Materials to Devices," 48 Solid State Electronics 1357 (2004).

Langdo et al., "Advanced SiGe free Strained Si on Insulator Substrates: Thermal Stability and Carrier Mobility Enhancement," Extended Abstracts of the 2003 Int'l Conf. on Solid State Devices and Materials 814 (2003).

Langdo et al., "Preparation of Novel SiGe-Free Strained Si on Insulator Substrates," 2002 IEEE Int'l SOI Conf. 211 (2002).

Langdo et al., "SiGe free Strained Si on Insulator by Wafer Bonding and Layer Transfer," 82 Applied Physics Letters 4256 (2003).

Larsen et al., "Diffusion in Relaxed and Strained SiGe Layers," T69 Physica Scripta 92 (1997).

Larsen et al., "Diffusion of Sb in Relaxed $Si_{1-x}Ge_x$," 68 Applied Physics Letters 2684 (1996).

Lauer et al., "Fully Depleted n-MOSFETs on Supercritical Thickness Strained SOI," 25 IEEE Electron Device Letters 83 (2004).

Law et al., "Continuum Based Modeling of Silicon Integrated Circuit Processing: An Object Oriented Approach," 12 Computational Mat. Sci. 289 (1998).

Lawrence, "Solute Diffusion in Plastically Deformed Silicon Crystals," 18 British J. App. Physics 405 (1967).

Lee et al., "Optimized Strained Si/Strained Ge DualChannel Heterostructures for High Mobility P- and N-MOSFETs," 2003 IEEE IEDM Tech. Dig. 429 (2003).

Lee et al., "Strained Si, SiGe, and Ge Channels for High-mobility Metal-oxide-semiconductor Field-effect Transistors," 97 J. App. Physics 011101-1 (2005).

Lee et al., "Characteristics of TaN Gate MOSFET with Ultrathin Hafnium Oxide (8Å-12Å)," IEDM, Apr. 2000, pp. 39-42.

LeGoues et al., "Anomalous Strain Relaxation in SiGe Thin Films and Superlattices," 66 Physical Rev. Letters 2903 (1991).

Leitz, "A High Throughput, Ultra-low Roughness, SiGe-free Strained Si Regrowth Process," 8 Mat. Sci. in Semiconductor Processing 187 (2005).

Leong et al., "A Self-Aligned Epitaxially Grown Channel MOSFET Device Architecture for Strained Si/SiGe Systems," 369 Thin Solid Films, pp. 375-378 (2000).

Lim et al., "A Study of the Oxidation Behavior and the Postannealing Effect in a Graded SiGe/Si Heterostructure," 31 J. Electronic Mat. 529 (2002).

Linder et al., "Reduction of Dislocation Density in Mismatched SiGe/Si Using a Low-Temperature Si Buffer Layer," 70 Applied Physics Letters 3224 (1997).

Liu, et al., "Interplay of Stress, Structure, and Stoichiometry in Ge-Covered Si(001)," 76 Physical Rev. Letters 3156 (1996).

Liu et al., "Wet Oxidation of GeSi at 700° C," 71 J. App. Physics 4015 (1992).

Loechelt et al., "Measurement and Modeling of Boron Diffusion in Si and Strained Si1-x Gex Epitaxial Layers During Rapid Thermal Annealing," 74 J. App. Physics 5520 (1993).

Lochtefeld et al., "Investigating the Relationship Between Electron Mobility and Velocity in Deeply Scaled NMOS via Mechanical Stress," 22 IEEE Electron Device Letters 12, pp. 591-593 (2001).

Lu et al., "Pressure-enhanced Crystallization Kinetics of Amorphous Si and Ge: Implications for Point-defect Mechanisms," 70 J. App. Physics 5323 (1991).

Maiti et al., "Hole Mobility Enhancement in Strained-Si p-MOSFETs Under High Vertical Field," 41 Solid State Electronics 1863 (1997).

Maleville et al., "Physical Phenomena Involved in the Smart-Cut® Process," 96-3 Electrochemical Soc'y Proceedings 34 (1996).

Manasevit et al., "Electron Mobility Enhancement in Epitaxial Multilayer Si-$Si_{1-x}Ge_x$ Alloy Films on (100) Si," 41 Applied Physics Letters 464 (1982).

Manchanda et al., "Si-Doped Aluminates for High Temperature Metal-Gate CMOS: Zr-AI-Si-O, A Novel Gate Dielectric for Low Power Applications," IEDM, Apr. 2000, pp. 23-26.

Matthews, et al., "Defects in Epitaxial Multilayers," 27 J. Crystal Growth 118 (1974).

McNeill et al., "Low Temperature Epitaxial Silicon Growth in a Rapid Thermal Processor," 224 Mat. Research Soc'y Symp. Proceedings 235 (1991).

McQuhae et al., "The Lattice Contraction Coefficient of Boron and Phosphorus in Silicon," 15 Solid State Electronics 259 (1972).

Meyerson, "Low-temperature Si and Si: Ge Epitaxy by Ultrahighvacuum/Chemical Vapor Deposition: Process Fundamentals," 34 IBM J. Research & Dev. 806 (1990).

Meyerson, "UHV/CVD Growth of Si and Si:Ge Alloys: Chemistry, Physics, and Device Applications," 80 Proceedings of the IEEE 1592 (1992).

Mii et al., "Extremely High Electron Mobility in Si/Ge$_x$Si$_{1-x}$ Structures Grown by Molecular Beam Epitaxy," 59 Applied Physics Letters 1611 (1991).

Mizuo et al., "Investigation of Point Defects in Si by Impurity Diffusion," 36 Mat. Resources Soc'y Symp. Proc. 125 (1985).

Mizuo et al., "Suppression by Pre-Diffusion Annealing of Anomalous Diffusion of B and P in Si Directly Masked with Si3N4 Films," 20 Japanese J. App. Physics 1749 (1981).

Morin et al., "Electrical Properties of Silicon Containing Arsenic and Boron," 96 Physical Rev. 28 (1954).

Moriya et al., "Boron Diffusion in Strained Si$_{1-x}$Ge$_x$ Epitaxial Layers," 71 Physical Rev. Letters 883 (1993).

Mukhhopadhyay et al., "Properties of SiGe Oxides Grown in a Microwave Oxygen Plasma," 78 J. App. Physics 6135 (1995).

Nabarro, "Theory of Crystal Dislocations" (Dover Publications Inc. 1967).

Nayak et al., "High-mobility p-Channel Metal-oxide-semiconductor Field-effect Transistor on Strained Si," 62 Applied Physics Letters 2853 (1993).

Nayak et al., "Low-field Hole Mobility of Strained Si on (100) Si$_{1-x}$Ge$_x$ Substrate," 64 Applied Physics Letters 2514 (1994).

Nelson et al., "Room-temperature Electron Mobility in Strained Si/SiGe Heterostructures," 63 Applied Physics Letters 367 (1993).

Nichols et al., "Mechanisms of Dopant Impurity Diffusion in Silicon," 40 Physical Rev. B 5484 (1989).

Nikanorov et al., "Elastic Properties of Silicon," 13 Soviet Physics—Solid State 2516 (1972).

Ning, "Distribution of Residual Stresses in Boron Doped p+ Silicon Films," 143 J. Electrochemical Soc'y 3389 (1996).

Noble et al., "Reduction in Misfit Dislocation Density by the Selective Growth of Si1-xGex/Si in Small Areas," 56 Applied Physics Letters 51 (1990).

Noble et al., "Thermal Stability of Si/Si$_{1-x}$Ge$_x$/Si Heterojunction Bipolar Transistor Structures Grown by Limited Reaction Processing," 55 Applied Physics Letters 1978 (1989).

Noda et al., "A.0.1- μm Delta-Doped MOSFET Fabricated with Post-Low-Energy Implanting Selective Epitaxy," 45 IEEE Transactions on Electron Devices 4, pp. 809-814 (1998).

Oberhuber et al., "Subband Structure and mobility of Two-dimensional Holes in Strained Si/SiGe MOSFET's," 58 Physical Rev. B 9941 (1998).

Oh et al., "50 nm Vertical Replacement-Gate (VRG) pMOSFETs," IEDM, pp. 65-68 (Apr. 2000).

Ohguro et al., "An 0.18-μm CMOS for Mixed Digital and Analog Applications with Zero-Volt-Vth Epitaxial-Channel MOSFET's," 46 IEEE Transactions on Electron Devices 7, pp. 1378-1383 (1999).

Ohguro et al., "Undoped Epitaxial Si Channel n-MOSFET Grown by UHV-CVD with Preheating,"45 IEEE Transactions on Electron Devices 3, pp. 710-716 (1998).

Ohguro et al., "0.15-μm Buried-Channel p-MOSFET's with Ultrathin Boron-Doped Epitaxial Si Layer," 45 IEEE Transactions on Electron Devices 3, pp. 717-721 (1998).

Olsen et al, "High performance nMOSFETs Using a Novel Strained Si/SiGe CMOS Architecture," 50 IEEE Transactions on Electron Devices 1961 (2003).

Ootsuka et al., "A Highly Dense, High-Performance 130nm node CMOS Technology for Large Scale System-on-a-Chip Applications," 2000 IEEE IEDM Tech. Dig., pp. 575-578.

Osada et al., "Effect of Stress in the Deposited Silicon Nitride Films on Boron Diffusion of Silicon," 142 J. Electrochemical Soc'y 202 (1995).

Ota et al., "Novel Locally Strained Channel Technique for High Performance 55nm CMOS," 2002 IEEE IEDM Tech. Dig., pp. 27-30.

Öztürk, et al., "Advanced Si$_{1-x}$Ge$_x$ Source/Drain and Contact Technologies for Sub-70 nm CMOS," 2002 IEEE IEDM Tech. Dig., pp. 375-378.

Öztürk et al., "Low Resistivity Nickel Germanosilicide Contacts to Ultra-Shallow Si$_{1-x}$Ge$_x$ Source/Drain Junctions for Nanoscale CMOS," 2003 IEEE IEDM Tech. Dig., pp. 497-500.

Öztürk et al., "Selective Silicon-Gremanium Source/Drain Technology for Nanoscale CMOS," 717 Mat. Res. Soc. Symp. Proc., pp. C4.1.1-C4.1.12 (2002).

Öztürk et al., "Ultra-Shallow Source/Drain Junctions for Nanoscale CMOS Using Selective Silicon-Germanium Technology," Extended Abstracts of International Workshop on Junction Technology, pp. 77-82 (2001).

Patton, "Silicon-Germanium-Base Heterojunction Bipolar Transistors by Molecular Beam Epitaxy," 9 IEEE Electron Device Letters 165 (1988).

Paul et al., "Electrical Properties and Uniformity of Two Dimensional Electron Gases Grown on Cleaned SiGe Virtual Substrates," 16 J. Vacuum Sci. & Tech. B 1644 (1998).

People, "Physics and Applications of Ge$_x$Si$_{1-x}$/Si Strained-Layer Heterostructures," QE-22 IEEE Journal of Quantum Electronics 1696 (1986).

People, et al., "Band Alignments of Coherently Strained Ge$_x$Si$_{1-x}$/Si Heterostructures on <001> Ge$_y$Si$_{1-y}$ Substrates," 48 Applied Physics Letters 538 (1986).

People et al., "Modulation Doping in GexSi1-x/Si Strained Layer Heterostructures," 45 Applied Physics Letters 1231 (1984).

People et al., "Modulation Doping in Ge(x)Si(1 x)/Si Strained Layer Heterostructures: Effects of Alloy Layer thickness, Doping Setback, and Cladding Layer Dopant Concentration," 3 J. Vacuum Sci. & Tech. A 846 (1985).

People et al., "Temperature Dependence of Hole Mobilities in Selectively Doped Ge(x)Si(1-x)/Si Strained Layer Heterojunctions," Proceedings of the First Int'l Symp. on Silicon Molecular Beam Epitaxy 360 (1985).

Perera et al., "Trench Isolation for 0.45 μm Active Pitch and Below," 1995 IEDM 679.

Petersen, "Silicon as a Mechanical Material," 70 Proceedings of the IEEE 420.

Pruijmboom et al., "Heterojunction Bipolar Transistors with Si1-xGex Base," 19 Microelectronic Engineering 427 (1992).

Prussin, "Generation and Distribution of Dislocations by Solute Diffusion," 32 J. App. Physics 1876 (1961).

Rafferty, "Stress Effects in Silicon Oxidation—Simulation and Experiments," (1989) (unpublished Ph.D. dissertation, Stanford University).

Rieger et al., "Electronic-band Parameters in Strained Si$_{1-x}$Ge$_x$ Alloys on Si$_{1-y}$Ge$_y$ Substrates," 48 Physical Rev. B 276 (1993).

Rim et al., "Characteristics and Device Design of Sub-100 nm Strained Si N- and PMOSFETs," 2002 Symp. on VLSI Tech. Dig. of Tech. Papers 98.

Rim et al., "Transconductance Enhancement in Deep Submicron Strained-Si n-MOSFETs," 1998 IEDM 707.

Ringel et al., "III-V Space Solar Cells on Si Substrates Using Graded GeSi Buffers," 16th European Photovoltaic Solar Energy Conf. Tech. Dig. 939 (2000).

Rosenberg et al., "Self-Aligned Germanium MOSFET's Using a Nitrided Native Oxide Gate Insulator," 9 IEEE Electron Device Letters 639 (1988).

Rueda et al., "Mechanical Stress Modeling for Silicon Fabrication Processes," 1997 International Conf. on Simulation of Semiconductor Processes and Devices Dig. 53.

Rueda et al., "Modeling of Strain in Boron-Doped Silicon Cantilevers," 1998 International Conf. on Modeling and Simulation of Microsystems, Semiconductors, Sensors and Actuators 94.

Sabnis et al., Characterization of the Electron Mobility in the Inverted <100> Si Surface, 1979 IEDM 18.

Sadeghzadeh et al., "Wave Function-dependent Mobility and Suppression of Interface Roughness Scattering in a Strained SiGe p-Channel Field-effect Structure," 76 Applied Physics Letters 2568 (2000).

Saino et al., "Control of Trench Sidewall Stress in Bias ECR-CVD Oxide-Filled STI for Enhanced DRAM Data Retention Time," 1998 IEDM Tech. Dig. 149.

Samavedam et al., "High-quality Germanium Photodiodes Integrated on Silicon Substrates Using Optimized Relaxed Graded Buffers," 73 Applied Physics Letters 2125 (1998).

Samavedam et al., "Novel Dislocation Structure and Surface Morphology Effects in Relaxed Ge/Si-Ge(graded)/Si Structures," 81 J. App. Physics 3108 (1997).

Samavedam et al., "Relaxation of Strained Si Layers Grown on SiGe Buffers," 17 J. Vacuum Sci. & Tech. B 1424 (1999).

Schäffler et al., "High-electron-mobility Si/SiGe Heterostructures: Influence of the Relaxed SiGe Buffer Layer," 7 Semiconductor Sci. Tech. 260 (1992) (letter to the editor).

Schonenberg et al., "The Stability of $Si_{1-x}Ge_x$ Strained Layers on Small-area Trench-isolated Silicon," 12 J. Mat. Research 364 (1997).

G. Schuberth et al., "High Electron Mobility in Modulation-Doped Si/SiGe Quantum well Structures," 59 Applied Physics Letters 3318 (1991).

Schwuttke et al., "High Energy Nitrogen Doping of Single-Crystal Silicon," Proceedings of the 1967 Santa Fe Conf. on Radiation Effects in Semiconductors 406 (1967).

Senez et al., "Two-dimensional Simulation of Local Oxidation of Silicon: Calibrated Viscoelastic Flow Analysis," 43 IEEE Transactions on Electron Devices 720 (1996).

Serebrinsky, "Stress Concentration in Silicon-Insulator Interfaces," 13 Solid-State Electronics 1435 (1970).

Sharma, "Diffusion in Silicon and Germanium," 70 & 71 Defect & Diffusion F. 1 (1990).

Shimizu et al., "Local Mechanical-Stress Control (LMC): A New Technique for CMOS-Performance Enhancement," 2001 IEEE IEDM Tech. Dig., pp. 433-436.

Sinha et al., "Thermal Stresses and Cracking Resistance of Dielectric Films (SiN, $Si_3N_4$, and $SiO_2$) on Si Substrates," 49 J. App. Physics 2423 (1978).

Smeys et al., "Influence of Process-induced Stress on Device Characteristics and its Impact on Scaled Device Performance," 46 IEEE Transactions on Electron Devices 1245 (1999).

Smith, "Piezoresistance Effect in Germanium and Silicon," 94 Physical Rev. 42 (1954).

Steegen et al., "Silicide Induced Pattern Density and Orientation Dependent Transconductance in MOS Transistors," 1999 IEDM Tech. Dig. 497.

Stern et al., "Charge Transfer and Low-temperature Electron Mobility in a Strained Si Layer in Relaxed $Si_{1-x}Ge_x$," 61 Applied Physics Letters 1110 (1992).

Stiffler, "Oxidation-induced Substrate Strain in Advanced Silicon Integrated-circuit Fabrication," 68 J. Applied Physics 351 (1990).

Streetman, "Solid State Electronic Devices," (4th ed., Prentice Hall 1995).

Subbanna et al., "How SiGe Evolved into a Manufacturable Semiconductor Production Process," 1999 IEEE International Solid-State Conf. 66.

Subbanna et al., "Si/SiGe p-Channel MOSFETs," 1991 Symp. on VLSI Tech. Dig. of Tech. Papers 103.

Sugii, "Thermal Stability of the Strained-$Si/Si_{0.7}Ge_{0.3}$ Heterostructure," 89 J. App. Physics 6459 (Jun. 2001).

Sugii et al., "High Electron Mobility in Strained Si Channel of Si1-xGex/Si/Si1-xGex Heterostructure with Abrupt Interface," 13 Semiconductor Sci. Tech. A140 (1998).

Sugii et al., "Role of $Si_{1-x}Ge_x$ Buffer Layer on Mobility Enhancement in a Strained-Si n-Channel Metal-Oxide-Semiconductor Field-Effect Transistor," 75 Applied Physics Letters 2948 (Nov. 1999).

Sugiyama et al., "Formation of Strained-Silicon Layer on Thin Relaxed SiGe/SiO2/Si Structure Using SIMOX Technology," 369 Thin Solid Films 199 (2000).

Sun et al., "Electron Mobility in Inversion and Accumulation Layers on Thermally Oxidized Silicon Surfaces," ED-27 IEEE Transactions on Electron Devices 1497 (1980).

T Fiory et al., "Thermal Relaxation of Metastable Strained-layer $Ge_xSi_{1-x}$/Si Epitaxy," 31 Physical Rev. 84063 (1985).

Takagi et al., "Characterization of Inversion-Layer Capacitance of Holes in Si MOSFET's," 46 IEEE Transactions on Electron Devices 1446 (1999).

Takagi et al., "Comparative Study of Phonon-limited Mobility of Two-dimensional Electrons in Strained and Unstrained Si Metal-oxide-semiconductor Field-effect Transistors," 80 J. Applied Physics 1567 (1996).

Takagi et al., "Mobility Enhancement of SOI MOSFETs due to Subband Modulation in Ultrathin SOI Films," 37 Japan J. Applied Physics 1289 (1998).

Takagi et al., "On the Universality of Inversion Layer Mobility in Si MOSFET's: Part I—Effects of Substrate Impurity Concentration," 41 IEEE Transactions on Electron Devices 2357 (1994).

Takagi et al., "On the Universality of Inversion Layer Mobility in Si MOSFET's: Part II—Effects of Surface Orientation," 41 IEEE Transactions on Electron Devices 2363 (1994).

Tamaki et al., "Evaluation of Dislocation Generation at $Si_3N_4$ Film Edges on Silicon Substrates by Selective Oxidation," 128 J. Electrochemical Soc'y 644 (1981).

Taraschi et al., "Relaxed SiGe on Insulator Fabricated via Wafer Bonding and Layer Transfer: Etch-back and Smart-cut Alternatives," Mar. 2001 Electrochemical Soc'y Proceedings 27 (2001).

Taraschi et al., "Relaxed SiGe-on-insulator Fabricated via Wafer Bonding and Etch Back," 20 J. Vacuum Sci. & Tech. B 725 (2002).

Taraschi et al., "Strained-Si-on-Insulator (SSOI) and SiGe-on Insulator (SGOI): Fabrication Obstacles and Solutions," 745 Mat. Resources Soc'y Symp. Proc. 105 (2003).

Teng et al., "Optimization of Sidewall Masked Isolation Process," 32 IEEE Transactions on Electron Devices 124 (1985).

Thompson et al., "A Logic Nanotechnology Featuring Strained-Silicon," 25 IEEE Electron Device Letters 4, pp. 191-193 (2004).

Thompson et al., "A 90 nm Logic Technology Featuring 50nm Strained-Silicon Channel Transistors, 7 layers of Cu Interconnects, Low k ILD, and 1um² SRAM Cell," 2002 IEEE IEDM Tech. Dig., pp. 61-64.

Tiwari et al., "Hole Mobility Improvement in Silicon-on-Insulator and Bulk Silicon Transistors Using Local Strain," 1997 IEEE IEDM Tech. Dig., pp. 939-941.

Todokoro et al., "The Stress-enhanced Diffusion of Boron in Silicon," 49 J. App. Physics 3527 (1978).

Todorov et al., "Direct Formation of Dielectric Thin Films on Silicon by Low Energy Ion Beam Bombardment," 36 Vacuum 929 (1986).

Tong et al., "Semiconductor Wafer Bonding: Science and Technology," (John Wiley & Sons, Inc. 1999).

Tsang et al., "Measurements of Alloy Composition and Strain in Thin $Ge_xSi_{1-x}$ Layers," 75 J. App. Physics 8098 (1994).

Tuppen et al., "Low Threading Dislocation Densities in Thick, Relaxed Si1-xGex Buffer Layers," 220 Mat. Resources Soc'y Symp. Proc. 187 (1991).

Tuppen et al., "Relaxation Processes in Si/Si1-xGex Strained Layer Superlattices—A Study by Raman Spectroscopy and X-ray Diffractometry," Proceedings of the Second Int'l Symp. on Silicon Molecular Beam Epitaxy 36 (1988).

Uchino et al., "A Raised Source/Drain Technology Using In-situ P-doped SiGe and B-doped Si for 0.1-µm CMOS ULSIs," 1997 IEEE IEDM Tech. Dig., pp. 479-482.

Van de Walle et al., "Germanium Diffusion and Strain Relaxation in $Si/Si_{1-x}Ge_x$/Si Structures," 183 Thin Solid Films 183 (1989).

Van de Walle, "Theoretical Calculations of Heterojunction Discontinuities in the Si/Ge System," 34 Physical Rev. B 5621 (1986).

van der Merwe, "Structure of Epitaxial Crystal Interfaces," 31 Surface Sci. 198 (1972).

van der Merwe et al., "Energy of Interfaces between Crystals," *in* Epitaxial Growth Part B 493 (J. W. Matthews ed., 1975).

Vancauwenberghe et al., "New SiGe Dielectrics Grown at Room Temperature by Low-energy Ion Beam Oxidation and Nitridation," 59 Applied Physics Letters 2031 (1991).

Verdonckt-Vandebroek et al., "High-Mobility Modulation-Doped Graded SiGe-Channel p-MOSFET's," 12 IEEE Electron Device Letters 447 (1991).

Vogelsang et al., "Electron Transport in Strained Si Layers on $Si_{1-x}Ge_x$ Substrates," 63 Applied Physics Letters 186 (1993).

Vuong et al., "Design of 25-nm SALVO PMOS Devices," 21 IEEE Electron Devices Letters 5, pp. 248-250 (2000).

Wang et al., "Substrate-Strained Silicon Technology: Process Integration," 2003 IEDM Tech. Dig. 61.

Washburn et al., "Defect Formation in Epitaxial Crystal Growth," 20 J. Electronic Materials 155 (1991).

Watanabe et al., "Invited: Perfect Crystal Device Technology," 44 J. of the Japan Society of Applied Physics 269 (Supp. 1975).

Watkins et al., "Lattice Vacancies and Interstitials in Silicon," 15 Chinese J. Physics, pp. 92 (1977).

Watt et al., "Universal Mobility-Field Curves for Electrons and Holes in MOS Inversion Layers," 1987 Symp. on VLSI Tech. Dig. of Tech. Papers 81.

Welser et al., "Strain Dependence of the Performance Enhancement in Strained-Si n-MOSFETs," 1994 IEEE IEDM Tech. Dig. 373.

Westhoff et al., "A Novel, High Quality SiGe Graded Buffer Growth Process Using $GeCl_4$," Jul. 2004 Electrochemical Soc'y Proceedings 589 (2004).

Williams, "The Significance of Ion Implantation Induced Stress in Silicon," 60A Physics Letters 330 (1977).

Willis, "The Energy of an Array of Dislocations: Implications for Strain Relaxation in Semiconductor Heterostructures," 62 Phil. Mag. A 115 (1990).

Willoughby et al., "Diffusion of Boron in Heavily Doped n- and p-Type Silicon," 59 J. App. Physics 2392 (1986).

Wong et al., "Fabrication of Ultrathin, Highly Uniform Thin-Film SOI MOSFET's with Low Series Resistance Using Pattern-Constrained Epitaxy," 44 IEEE Transactions on Electron Devices 7, pp. 1131-1135 (1997).

Wortman et al., "Effect of Mechanical Stress on p-n Junction Device Characteristics," 35 J. App. Physics 2122 (1964).

Wortman et al., "Effect of Mechanical Stress on p-n Junction Device Characteristics. II. Generation-Recombination Current," 37 J. App. Physics 3527 (1966).

Wortman et al., "Young's Modulus, Shear Modulus, and Poisson's Ratio in Silicon and Germanium," 36 J. App. Physics 153 (1965).

Wu, "Novel Etch-Stop Materials for Silicon Micromachining," (1997) (unpublished MA thesis, Massachusetts Institute of Technology).

Yang et al., "The Quantitative Determination of the Residual Stress Profile in Oxidized $p^+$ Silicon Films" 54 Sensors and Actuators A 684 (1996).

Yeo et al., "Enhanced Performance in Sub-100 nm CMOSFETs using Strained Epitaxial Silicon-Germanium," 2000 IEEE IEDM, pp. 753-756.

Yeo et al., "Design and Fabrication of 50-nm Thin-Body p-MOSFETs with a SiGe Heterostructure Channel," 49 IEEE Transactions on Electron Devices 2, pp. 279-286 (2002).

AmberWave Systems Corporation's Responses to Intel's Fifth Set of Interrogatories, U.S.D.C. District of Delaware, C.A. No. 05-301-KAJ (consolidated) (Jun. 19, 2006).

AmberWave Systems Corporation's Responses to Intel's Fifth Set of Requests for Production, U.S.D.C. District of Delaware, C.A. No. 05-301-KAJ (consolidated) (Jun. 30, 2006).

AmberWave Systems Corporation's Responses to Intel's Fourth Set of Interrogatories, U.S.D.C. District of Delaware, C.A. No. 05-301-KAJ (consolidated) (Feb. 27, 2006).

AmberWave Systems Corporation's Responses to Intel's Fourth Set of Requests for Production, U.S.D.C. District of Delaware, C.A. No. 05-301-KAJ (consolidated) (May 5, 2006).

AmberWave Systems Corporation's Responses to Intel's Sixth Set of Interrogatories, U.S.D.C. District of Delaware, C.A. No. 05-301-KAJ (consolidated) (Sep. 5, 2006).

AmberWave Systems Corporation's Responses to Intel's Third Set of Requests for Production, U.S.D.C. District of Delaware, C.A. No. 05-301-KAJ (consolidated) (Feb. 10, 2006).

AmberWave Systems Corporation's Second Supplemental Responses to Intel's Third Set of Interrogatories, U.S.D.C., District of Delaware, C.A. No. 05-301-KAJ (consolidated) (Jul. 12, 2006).

Final Office Action in Japanese Patent Application No. 2003-529509, mailed Oct. 28, 2008, 1 page (translation).

Intel's Second Amended Responses and Objections to AmberWave's First Set of Interrogatories, U.S.D.C., District of Delaware, C.A. No. 05-301-KAJ (consolidated) (Aug. 7, 2006).

Office Action in Japanese Patent Application No. 2003-529509, mailed Apr. 22, 2008, 4 pages (translation).

Office Action in Japanese Patent Application No. 2003-529509, mailed Sep. 11, 2007, 5 pages (translation).

\* cited by examiner

RF CIRCUITS INCLUDING TRANSISTORS HAVING STRAINED MATERIAL LAYERS

CROSS-REFERENCE TO RELATED APPLICATION

This application is a continuation of, and incorporates herein by reference, in its entirety, U.S. patent application Ser. No. 10/253,361, filed 24 Sep. 2002, which claims priority to and the benefit of, and incorporates herein by reference, in its entirety, provisional U.S. patent application Ser. No. 60/324,329, filed 24 Sep. 2001.

FIELD OF THE INVENTION

The present invention relates generally to circuits that process radio frequency (hereinafter, "RF") and microwave signals and, more specifically, to RF circuits that contain transistors, including field effect transistors (hereinafter, "FETs" or "MOSFETs") that incorporate one or more strained material layers.

BACKGROUND OF THE INVENTION

Continuous improvements in semiconductor process technology have extended the capability of silicon ("Si") CMOS devices into the RF and microwave domain. Improvements resulting in, for example, smaller FET gate lengths have increased the maximum frequency of operation. There has been long-standing interest in increasing the frequency capability of Si for many reasons, including the generally lower cost of Si-based devices compared to III-V devices, such as, for example, those fabricated from gallium arsenide ("GaAs") and indium phosphide ("InP"). Furthermore, given the overall maturity of Si process technology, mixed signal devices (i.e., devices that process both analog and digital signals on the same semiconductor chip), are generally more easily fabricated in Si than in other materials. Other advantages of Si include greater surface smoothness and a high thermal conductivity (approximately three times that of GaAs). Si also has a high dielectric constant that is generally unaffected by variations in temperature, or frequency, or both.

On the other hand, the intrinsic peak mobility of electrons in Si is approximately 600 cm$^2$ V$^{-1}$ s$^{-1}$. This is lower than the electron mobility of 8500 cm$^2$ V$^{-1}$ s$^{-1}$ in GaAs. Accordingly, for Si-based devices to have performance (per unit gate width) that is substantially equivalent to GaAs-based devices, Si gate lengths must be scaled downward significantly. For example, NMOS devices have been demonstrated that have cutoff frequencies between 120 GHz and 150 GHz, with effective electrical gate lengths on the order of 0.09 micrometer.

A problem with such significant downward scaling of gate length is that doing so affects the noise performance of the resulting device. Although long channel devices have been demonstrated that have a noise figure of approximately 1-2 dB, as gate lengths decrease, short channel (e.g., "shot") noise typically begins to degrade device performance. Adding one or more bipolar structures to the CMOS semiconductor chip (resulting in a "BiCMOS" design) can circumvent this problem. Nevertheless, a BiCMOS structure adds several steps to the CMOS fabrication process, thereby increasing production complexity and cost.

The Si substrates used in the fabrication of RF devices typically have a lower resistivity compared to GaAs substrates. This generally causes greater signal losses in Si compared to GaAs. This, in turn, typically results in increased power consumption in the GHz regime for Si-based devices, and lower quality ("Q") factors for passive Si-based components, the latter of which degrades the noise performance.

RF circuits, such as voltage controlled oscillators ("VCOs"), low noise amplifiers ("LNAs"), and phase locked loops ("PLLs"), typically include one or more transistors. When operated at high frequency, these circuits can suffer from poor performance like that described above due, at least in part, to their use of one or more conventional transistors in the overall circuit designs. Converting such designs to GaAs or BiCMOS can be problematic, particularly when a circuit is monolithic (i.e., when the most or all of the circuit is contained on one semiconductor chip). The increase in cost and complexity of such a conversion can make it impractical or impossible.

From the foregoing, it is apparent that there is still a need for a way to improve the performance of RF circuits, particularly at high frequencies, while avoiding changes to the circuit designs or fabrication sequences that can increase cost and complexity.

SUMMARY OF THE INVENTION

The present invention provides circuits for processing RF signals that exhibit improved performance without requiring significant changes to design or fabrication. This is accomplished by including in the circuits devices (either active, or passive, or both) having enhanced material properties, such as, for example, increased electron and hole mobilities. Consequently, these devices exhibit superior performance that, in turn, influences overall circuit operation.

The invention features a circuit that includes one or more FETs to which an RF signal is applied. In different embodiments, the circuit can include one or more of a voltage controlled oscillator, a low noise amplifier, or phase locked loop. The FETs are fabricated in a semiconductor substrate that includes at least one planarized layer. The channel regions of these FETs include one or more strained material layers disposed on a planarized layer.

In certain embodiments, the semiconductor substrate can include Si, SiGe, or any combination of these materials. It can also be multi-layered. In this latter case, the layers can include relaxed SiGe disposed on compositionally graded SiGe. The layers can also include relaxed SiGe disposed on Si. One or more buried insulating layers may be included as well.

In other embodiments, the strained layer can include Si, Ge, SiGe, or any combination of these materials. At least about fifty Angstroms of the strained layer farthest from the planarized layer defines a distal zone where an impurity gradient (describing the concentration of one or more impurities (i.e., dopants) as a function of location in the device) has a value that is substantially equal to zero.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings, in which.

DETAILED DESCRIPTION

Figure 1:
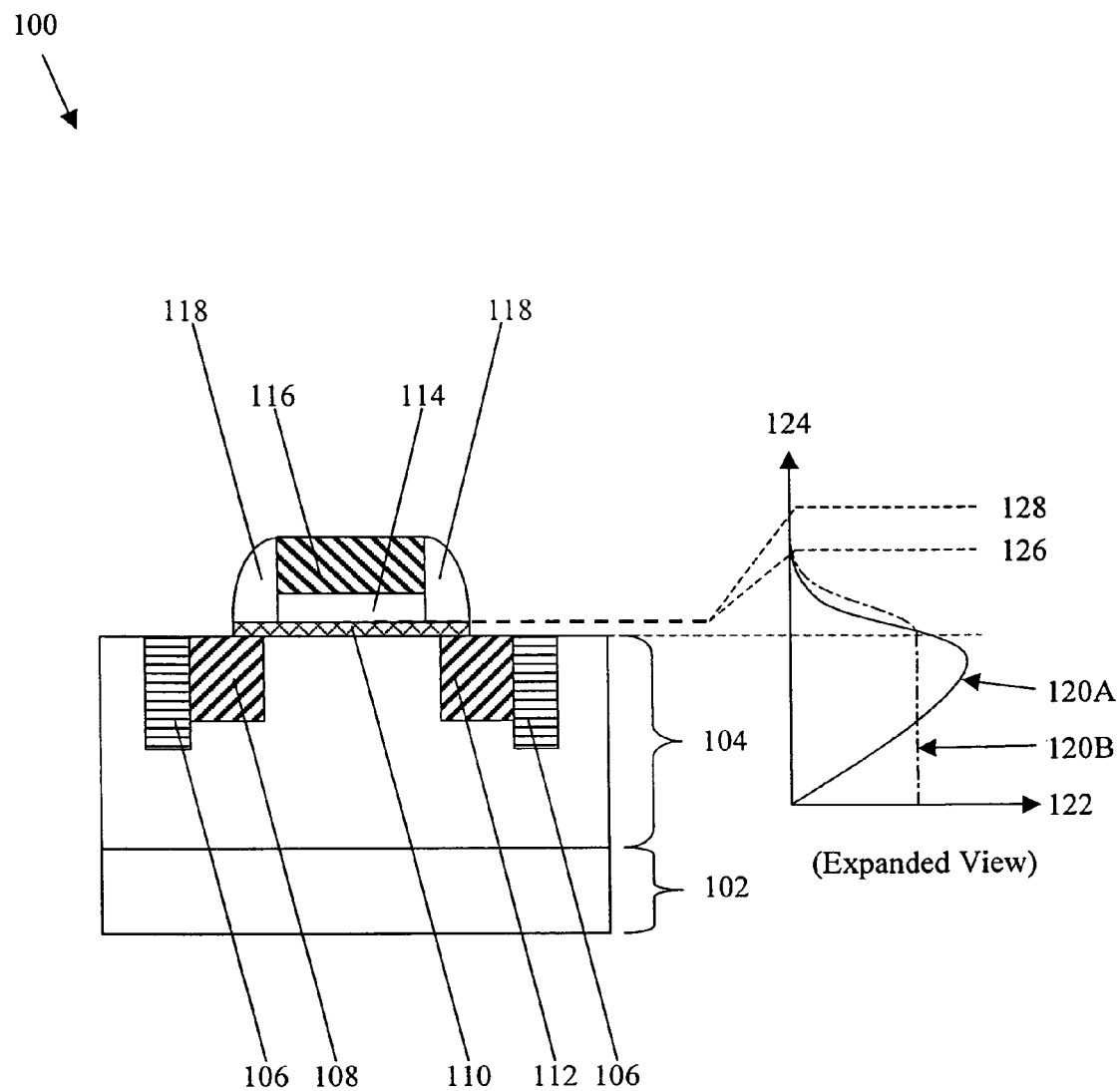
FIG. 1 is a schematic (unscaled) cross-sectional view that depicts a FET in accordance with an embodiment of the invention.

As shown in the drawings for the purposes of illustration, the invention may be embodied in a circuit, such as, for example, a voltage controlled oscillator, low noise amplifier, or a phase locked loop, for processing an RF signal. The circuit includes at least one FET fabricated in a semiconductor a substrate that has at least one planarized layer and one or more strained material layers disposed on the planarized layer. Consequently, the FET, and the circuit, exhibit improved performance, particularly at high signal frequencies. In some embodiments, the strained material layers may be characterized by at least one diffusion impurity gradient that has a value that is substantially equal to zero in a particular area of the strained layer.

Technical Background

When Si is placed under tension, the degeneracy of the conduction band splits, forcing two valleys to be occupied instead of six. Consequently, the in-plane mobility is increased, reaching a value as high as 2900 $cm^2 V^{-1} s^{-1}$ in buried channel devices for electron densities of $10^{11}$-$10^{12}$ $cm^{-2}$. Mobility enhancement can be incorporated into a MOS device by disposing a compositionally graded buffer layer between a SiGe film and the Si substrate. The grading spreads the lattice mismatch within the buffer over a distance, thereby minimizing the number of lattice dislocations reaching the surface on which the film is disposed, and thus providing a method for growing high-quality relaxed SiGe films on Si. Typically, a Si film having a thickness is grown on the relaxed SiGe film. Since the lattice constant of SiGe is larger than that of Si, the Si film is under biaxial tension, causing the carriers to exhibit strain-enhanced mobilities.

Unlike many GaAs high mobility technologies, strained Si devices generally can be fabricated with standard Si CMOS processing methods and tools. This compatibility generally allows for performance enhancement with minimal additional capital expenditures. The technology is also scalable and thus can be implemented in both long and short channel devices. Furthermore, if desired, strained Si can be incorporated with Si-on-insulator ("SOI") technology in order to provide ultra-high speed and low power circuits. In summary, since strained Si technology is similar to bulk Si technology, it is not exclusive to other performance enhancing methods. Consequently, strained Si is well-suited to improve the performance of CMOS-based microwave circuits.

The strained Si material system can improve microwave circuit performance several ways. Example categories include:

1. Circuit and Device Performance—Gain and Noise.
  a. For RF circuits, the increased mobility improves the device gain compared to CMOS-based designs.
  b. Enhanced mobility lowers the minimum noise figure on buried channel or surface channel devices. This is applicable to, for example, LNAs, VCOs, and PLLs.
  c. Use of buried or surface channel devices having improved mobility and increased effective mass perpendicular to the oxide interface (i.e., perpendicular to the direction of current flow) lowers flicker noise, thereby enabling higher performance RF circuits (e.g., VCOs and PLLs).
2. Ease of Fabrication.
  a. Substrate planarization and re-growth facilitates photolithography and fabrication of surface or buried channel strained Si layer devices on substrates containing up to, for example, 30% Ge.
  b. Substrate planarization and re-growth for higher Ge concentration enables the photolithographically defined, higher performance modulation doped FETs ("MODFETs") for RF circuits (by virtue of increased hetero-confinement).
  c. A digital component may be integrated easily with the RF circuit.
3. Passive Components—Ease of Fabrication, Q-factor and Noise Enhancement.
  a. Because of implant control for buried channel devices (compared with grown modulation doped structures), there is generally no need to etch away or counter dope one or more epilayers (possibly causing irrecoverable damage, negating the need for additional reconstruction or passivation).
  b. Because of planarized substrates, there is greater control of defect densities and material quality of the epilayers. There is also greater control (typically by ion implantation) of the substrate contact and doping allowing fabrication of low electrical resistance regions (for ground planes or contacts), and regions of high electrical resistance that enable fabrication of passive components of higher Q and lower noise.
  c. A high quality oxide may be grown for varactors having a high Q factor.

Strained Si Mobility Enhancement

Typically, a Si channel in a FET is placed under biaxial tension by the underlying, larger-lattice-constant SiGe layer. This strain causes the conduction band to split into two-fold and four-fold degenerate bands. The two-fold band is preferentially occupied since it sits at a lower energy. The energy separation between the bands is approximately:

$$\Delta E_{strain} = 0.67x [eV] \qquad \text{(Equation 1)}$$

where "x" is equal to the Ge content in the SiGe layer. Equation (1) shows that the band splitting increases as the Ge content increases. This splitting causes mobility enhancement (compared to unstrained material) typically by two mechanisms. First, the two-fold band has a lower effective mass, and thus higher mobility than the four-fold band. Therefore, as the higher mobility band becomes energetically preferred, the average carrier mobility increases. Second, since the carriers are occupying two orbitals instead of six, inter-valley phonon scattering is reduced, further enhancing the carrier mobility.

At a concentration of 20% Ge, the electron mobility enhancement at high fields (0.2~0.7 MV/cm) is approximately 1.75 that of unstrained material, while the hole mobility enhancement is generally negligible. When the Ge concentration is increased to 30%, the electron mobility enhancement improves slightly to 1.8 and the hole mobility enhancement rises to about 1.4. Above 30% Ge, the band splitting is large enough that almost all of the carriers occupy the high mobility band. As a result, mobility enhancement as a function of Ge concentration saturates above about 30% Ge. Because of the low hole mobility, higher mobility, buried P-channel MOSFETs may offer an improved alternative.

Drain Current Enhancement

FETs fabricated using one or more strained Si layers have, for a given source-drain bias, greater drain current compared to FETs fabricated using unstrained Si layers. FET transconductance is defined by:

$$g_m \equiv \frac{\partial I_D}{\partial V_G}\bigg|_{V_D} \quad \text{(Equation 2)}$$

where "$I_D$" is the drain current, "$V_G$" is the gate bias voltage, and "$V_D$" is the source-drain bias. Accordingly, the greater drain current results in an increased transconductance. Since transistor gain is generally directly proportional to transconductance, the former is also increased by the greater drain current.

By way of example, consider an n-channel MOSFET fabricated in 0.8 micron process technology using strained Si. The typical process affords low contact resistance. It also minimizes the amount of diffusion of Ge from the buffer layer into the strained material, particularly in at least about fifty Angstroms of the strained material distal to (e.g., farthest from) the buffer layer. This configuration maximizes the mobility increase in the surface strained layer.

This example MOSFET structure has, at about 100 mV source-drain bias, a transconductance approximately twice that of a 0.8 micron n-channel MOSFET fabricated without strained Si operating at the same bias point. At a source-drain bias of about 2.5 V, the FET with the strained Si has a transconductance approximately 1.4 that of the FET lacking the strained Si.

Given the proportional relationship between them, the transconductance also impacts the device cutoff frequency:

$$f_T \propto \frac{g_m}{C_{OX}} \quad \text{(Equation 3)}$$

where "$C_{OX}$" is the FET gate capacitance. Since, for example, having a strained Si surface layer can double the transconductance, the cutoff frequency correspondingly doubles for a range of gate biases when compared to the FET without the strained Si.

Noise Figure Improvement

For discrete MOSFET devices, the noise figure at both high and low frequencies is a parameter that can affect the performance of RF and microwave circuits. Noise generally includes two components: flicker ("1/f") noise and "white noise" (noise that is generally independent of frequency). At low frequencies, flicker noise dominates, typically affecting the quality of circuits such as VCOs or PLLs. At higher frequencies, white noise dominates and typically affects the noise figure of LNAs.

With respect to flicker noise, using p-channel MOSFETs in place of n-channel MOSFETs will generally improve the performance of VCOs and PLLs. One reason for this effect is that free charge carriers in the inversion layer at the oxide-semiconductor interface quantum mechanically tunnel into traps within the oxide causing random fluctuations (and hence noise) in the drain current. The tunneling probability ("P") may be expressed as being exponentially dependent on the product of the barrier height ("$\Delta E$") and transverse effective mass "$m_t^*$" (perpendicular to the oxide), that is:

$$P \propto e^{-\Delta E m_t^*} \quad \text{(Equation 4)}$$

Given that the transverse effective mass for electrons (equal to 0.19 $m_0$, where $m_0$ is the electron rest mass) is less than that for (heavy) holes (0.49 $m_0$), equation (4) shows that the probability of (heavy) holes tunneling into traps in the oxide is significantly lower compared to electrons. Consequently, there is typically a reduction in 1/f noise in p-channel MOSFETs compared to n-channel MOSFETs, potentially as much as at least one order of magnitude. The reduced mobility of the holes relative to electrons further reduces the 1/f noise component.

In strained Si, the electron tunneling generally occurs along the axes of the constant energy surfaces, i.e., longitudinally along the symmetry axes. Accordingly, the tunneling effective mass for electrons is the longitudinal effective mass, "$m_l^*$", which is equal to 0.98 $m_0$. This is greater than the transverse effective mass for electrons (0.19 $m_0$), which applies in the case of tunneling in unstrained (i.e., bulk) Si.

The oxide-Si potential barrier height for electrons in strained Si is approximately 2.5 eV and, for holes, it is approximately 5.0 eV. Multiplying each of these terms by the appropriate effective mass (0.98 $m_0$ and 0.49 $m_0$, respectively) yields about the same value. Consequently, the probability of electrons tunneling into traps within the oxide will be the same in a strained Si device as that for holes in a bulk Si device. Therefore, the 1/f noise component in strained surface n-channel MOSFETs approaches that of p-channel MOSFETs, thereby offering substantial improvement over n-channel MOSFETs fabricated in unstrained Si.

With respect to white noise, the minimum noise figure ("$NF_{min}$") at frequency "f" of a MOSFET or MODFET, assuming that thermal noise from parasitic resistances $R_{source}$ and $R_{gate}$ dominate, may be expressed as:

$$NF_{min} = 1 + \left(\frac{f}{f_T}\right) K_f \sqrt{g_m(R_{source} + R_{gate})} \quad \text{(Equation 5)}$$

where "$K_f$" is a fitting factor. $K_f$, $R_{source}$, and $R_{gate}$ typically vary depending on the fabrication process and parasitic capacitance values. Nevertheless, by equation (3), the cutoff frequency is proportional to the transconductance, so increasing the latter will improve (decrease) the minimum noise figure of the device. In other words, by equations (3) and (5), the effect of increased transconductance and cutoff frequency will affect $NF_{min}$ by a value corresponding to $g_m^{-1/2}$.

By way of example, the following table (Table 1) shows some typical values for the mobility enhancement, transconductance, cutoff frequency, and minimum noise figure for various strained Si configurations (Ge percentages shown), normalized to bulk Si values:

TABLE 1

| Material Configuration | Mobility Enhancement | Transconductance (Gain) | Cutoff Frequency | Minimum Noise Figure |
|---|---|---|---|---|
| 20% NMOS | 1.75 | 1.75 | 1.75 | 0.76 |
| 30% NMOS | 1.8 | 1.8 | 1.8 | 0.75 |

TABLE 1-continued

| Material Configuration | Mobility Enhancement | Trans-conductance (Gain) | Cutoff Frequency | Minimum Noise Figure |
|---|---|---|---|---|
| 20% PMOS | 1 | 1 | 1 | 1 |
| 30% PMOS | 1.4 | 1.4 | 1.4 | 0.85 |

The mobility enhancement leads to improvement in transconductance (i.e., gain) and cutoff frequency. The enhancement in noise figure can be difficult to predict, since the device geometry and process affect the values of parasitic contact resistances. Nevertheless, the reduction in the value of $g_m^{-1/2}$ typically results in a reduction in the noise figure for LNAs that include strained Si MOSFETs.

Buried Strained Channel Devices

The carrier mobility in a strained surface layer MOSFET can be improved by "burying" the strained layer. In this configuration, a SiGe "cap" layer having a thickness of about thirty to two hundred Angstroms is deposited on the strained layer (typically Si). An oxide (i.e., gate dielectric) is then deposited or grown on the cap layer, and the gate electrode is deposited on the oxide. Consequently, and unlike conventional Si MOSFETs, the gate dielectric layer is spatially separated (by the cap layer) from the active device channel (i.e., the strained layer). The corresponding conduction band offset allows two-dimensional carrier confinement within the strained Si quantum well.

The value of the electron mobility in such buried strained Si layers can reach 2900 cm$^2$ V$^{-1}$ s$^{-1}$. This is a substantial increase over the typical 600 cm$^2$ V$^{-1}$ s$^{-1}$ electron mobility in bulk Si MOSFETs.

The thickness of the oxide and cap layer generally affects the high frequency performance of the FET. By way of example, the following table (Table 2) shows some typical values for mobility enhancement, transconductance, cutoff frequency, and minimum noise figure (all normalized to bulk Si values) for various strained Si n-channel MOSFET configurations having different oxide and cap layer thicknesses:

TABLE 2

| Oxide Thickness [Angstroms] | Cap Layer Thickness [Angstroms] | Equivalent Oxide Thickness [Angstroms] | Mobility Enhancement | Trans-conductance (Gain) | Cutoff Frequency | Minimum Noise Figure |
|---|---|---|---|---|---|---|
| 50 | 50 | 66.7 | 4.3 | 3.2 | 3.2 | 0.56 |
| 50 | 100 | 83.3 | 4.3 | 2.5 | 2.5 | 0.63 |
| 30 | 50 | 46.7 | 4.3 | 2.8 | 2.8 | 0.59 |
| 30 | 100 | 63.3 | 4.3 | 2.0 | 2.0 | 0.71 |
| 15 | 50 | 31.7 | 4.3 | 2.0 | 2.0 | 0.71 |
| 15 | 100 | 48.3 | 4.3 | 1.3 | 1.3 | 0.87 |

The "equivalent oxide thickness" ("$T_{equivalent}$") approximates the combined effect of the oxide and cap layer thicknesses ("$T_{ox}$" and "$T_{cap}$", respectively), and is computed as follows:

$$T_{equivalent} = \varepsilon_{ox}\left(\frac{T_{ox}}{\varepsilon_{ox}} + \frac{T_{cap}}{\varepsilon_{cap}}\right) \quad \text{(Equation 6)}$$

where "$\varepsilon_{ox}$" and "$\varepsilon_{cap}$" are the permittivities of the oxide and cap layer, respectively.

As Table 2 shows, the values of mobility enhancement, transconductance, cutoff frequency, and minimum noise figure are improved compared to an n-channel MOSFET fabricated in bulk Si.

The spatial separation of charge carriers from the oxide interface by virtue of the cap layer also decreases 1/f noise, typically by about an order of magnitude. An example of this is seen in p-channel MOSFETs fabricated on buried channel pseudomorphic strained SiGe alloy layers. In these devices, the mobility is increased relative to bulk Si by a factor of about 1.5. Nevertheless, because the 1/f noise is an order of magnitude lower when compared with conventional p-channel MOSFETs, the implication is that the spatial separation of charges from the oxide interface dominates the magnitude of the 1/f noise. Consequently, spatial separation of carriers from the oxide interface in a buried strained layer structures further improves the 1/f noise component.

Example Device Structure

In one embodiment depicted schematically (i.e., unscaled) in FIG. 1, a FET 100 is fabricated in a semiconductor substrate 102, which may be Si, SiGe, or other compounds such as, for example, GaAs or InP. The substrate 102 can be multi-layered, and it can include relaxed SiGe disposed on compositionally graded SiGe, or relaxed SiGe disposed on Si. One or more of these layers may be planarized, typically by chemical mechanical polishing ("CMP"). The substrate 102 may also include a buried insulating layer, such as SiO$_2$ or Si$_3$N$_4$. The buried insulating layer may also be doped.

Disposed on the substrate 102 is an isolation well 104, typically including an oxide. Within the isolation well 104 are isolation trenches 106. A source region 108 and a drain region 112 are typically formed by ion implantation. A FET channel 110, which can have either n-type or p-type conductivity, is formed from one or more strained layers. The strained layers can include one or more layers of Si, Ge, or SiGe. The "strain" in the strained layers may be compressive or tensile, and it may be induced by lattice mismatch with respect to an adjacent layer. Alternatively, the strain may be induced mechanically by, for example, the deposition of overlayers, such as Si$_3$N$_4$. Another way to induce mechanical strain is to create underlying voids by, for example, implantation of one or more gases followed by annealing. Both of these approaches induce strain in the underlying substrate 102, in turn causing strain in the channel 110.

Disposed on at least part of the channel 110 is a gate dielectric 114, such as, for example, SiO$_2$, Si$_3$N$_4$, or any other material with a dielectric constant greater than that of SiO$_2$ (e.g., HfO$_2$, HfSiON). The gate dielectric 114 is typically twelve to one hundred Angstroms thick, and it can include a stacked structure (e.g., thin SiO$_2$ capped with another material having a high dielectric constant).

Disposed on the gate dielectric 114 is the gate electrode 116. The gate electrode 116 material can include doped or undoped polysilicon, doped or undoped poly-SiGe, or metal. Disposed about the gate electrode 116 are the transistor spacers 118. The transistor spacers 118 are typically formed by depositing a dielectric material, which may be the same material as the gate dielectric 114, followed by anisotropic etching.

Figure 1A:
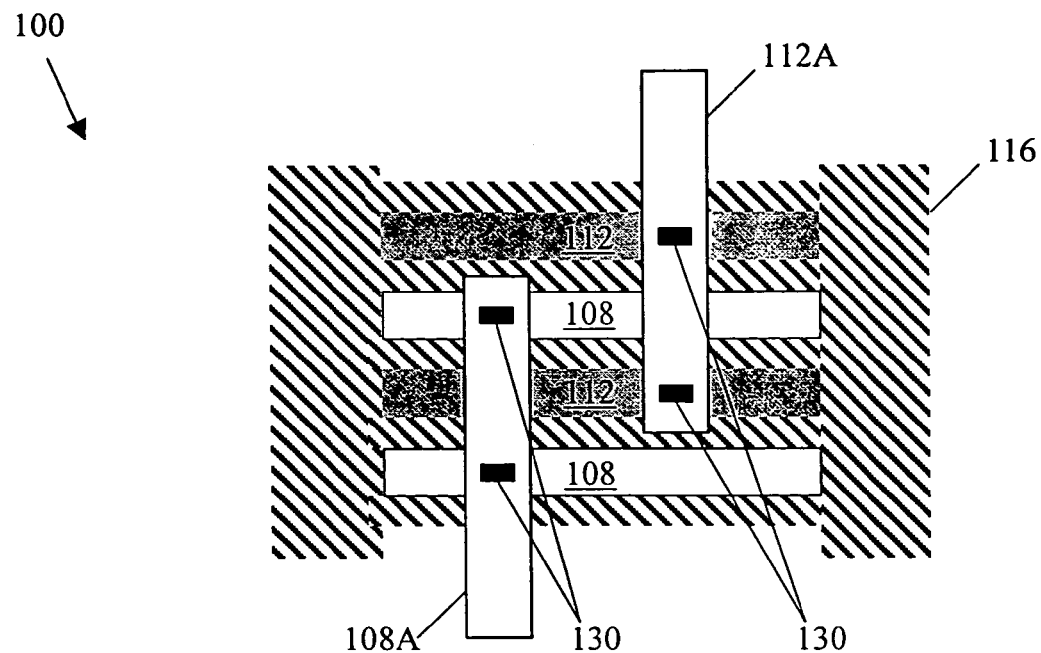
FIGS. 1A and 1B are schematic (unscaled) views that depict FETs in accordance with an embodiment of the invention.
Figure 1B:
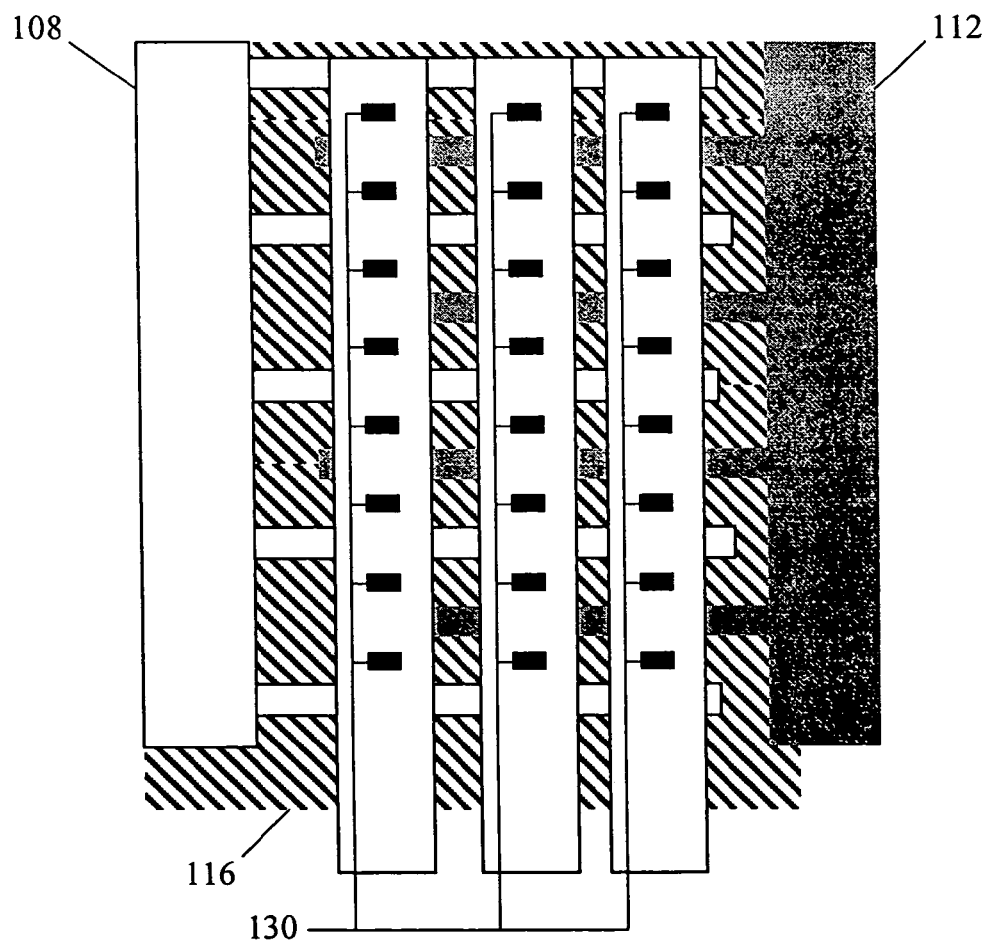

One way to improve the overall performance of the FET 100 is to employ an interdigitated, or "comb," structure, typically by connecting several FETs 100 in parallel, as depicted in FIGS. 1A and 1B. In such a configuration, a single source contact 108A and a single drain contact 112A are connected to the source region 108 and drain region 112, respectively, on each device. Each FET 100 uses the same gate electrode 116. This configuration typically reduces the resistance of the gate electrode 116, thereby reducing its time constant and improving frequency response.

The example interdigitated structure shown in FIG. 1A includes several separate source and drain regions 108, 112 with the common gate electrode 116 placed substantially between them. Single source and drain contacts 108A, 112A are connected to each source region 108 and drain region 112, respectively, typically at contact locations 130, by bridging the gate electrode 116. Another example of an interdigitated structure is shown in FIG. 1B and includes parallel FETs 100 that share a single, elongated source region 108 and a single, elongated drain region 112. These elongated regions are offset relative to each other. The gate electrode 116 is disposed, typically in a serpentine pattern, substantially within the area defined by the offset. Overlaying the gate electrode 116 are several bridging contacts, typically at contact locations 130, that help reduce its resistance, as discussed above.

The addition of the various material layers described above may be accomplished using any conventional deposition method (e.g., chemical vapor deposition ("CVD") or molecular beam epitaxy ("MBE")), and the method may be plasma-assisted. When these layers are added, a region that supplies excess carriers to the channel 110 may be disposed substantially adjacent to the latter. This region generally includes a p- or n-type impurity (i.e., dopant) that acts as a source of the excess carriers (holes or electrons, respectively). The presence of these excess carriers typically improves FET performance. The impurity can also be introduced after the addition of the layers using, for example, ion implantation.

An impurity gradient 120A, 120B (collectively, "120") characterizes the channel 110 and the substrate 102, as well as the isolation well 104. Axis 122 represents the impurity concentration, typically in units of $cm^{-3}$. Axis 124 corresponds to the location in the FET 100. Axis 124 is aligned with the FET 100 to illustrate a typical impurity profile, meaning that the impurity concentration at any point in the FET 100 can be ascertained as a function of location.

The impurity gradient 120 is shown in FIG. 1 in an expanded view that, for clarity, differs in scale compared to the remainder of (unscaled) FIG. 1. A distal zone of the channel 110 is the furthest part of the channel 110 that is located away from the substrate 102. The distal zone typically includes at least about fifty Angstroms of the furthest part of the channel 110. That is, the distal zone is at least about fifty Angstroms thick. The distal zone corresponds to that portion of the impurity gradient 120 between boundaries 126, 128 (expanded for clarity). Within the distal zone of the channel 110, the impurity gradient 120 has a value substantially equal to zero. The depicted shape of the impurity gradient 120 is not intended to be limiting, and the impurity gradient 120 can also have a value substantially equal to zero before reaching the boundary 126. For example, impurity gradient 120A may describe a profile of a p-type (e.g., boron) or n-type (e.g., phosphorous or arsenic) dopant introduced in the substrate 102. On the other hand, impurity gradient 120B may, for example, describe a substantially constant concentration of Ge, or Si, or both, in the substrate 102 that takes on a desired value (e.g., a reduced value) in the channel 110. Stated differently, the impurity gradient 120 may describe the concentration of any species in the substrate 102, including the substrate species itself, at any point in the FET 100.

As described above, an alternative embodiment includes disposing a relaxed SiGe "cap" layer between the channel 110 and the gate dielectric 114. The resulting structure is termed a buried strained channel FET, and it has many performance advantages over the surface strained channel FET depicted in FIG. 1.

Figure 2:
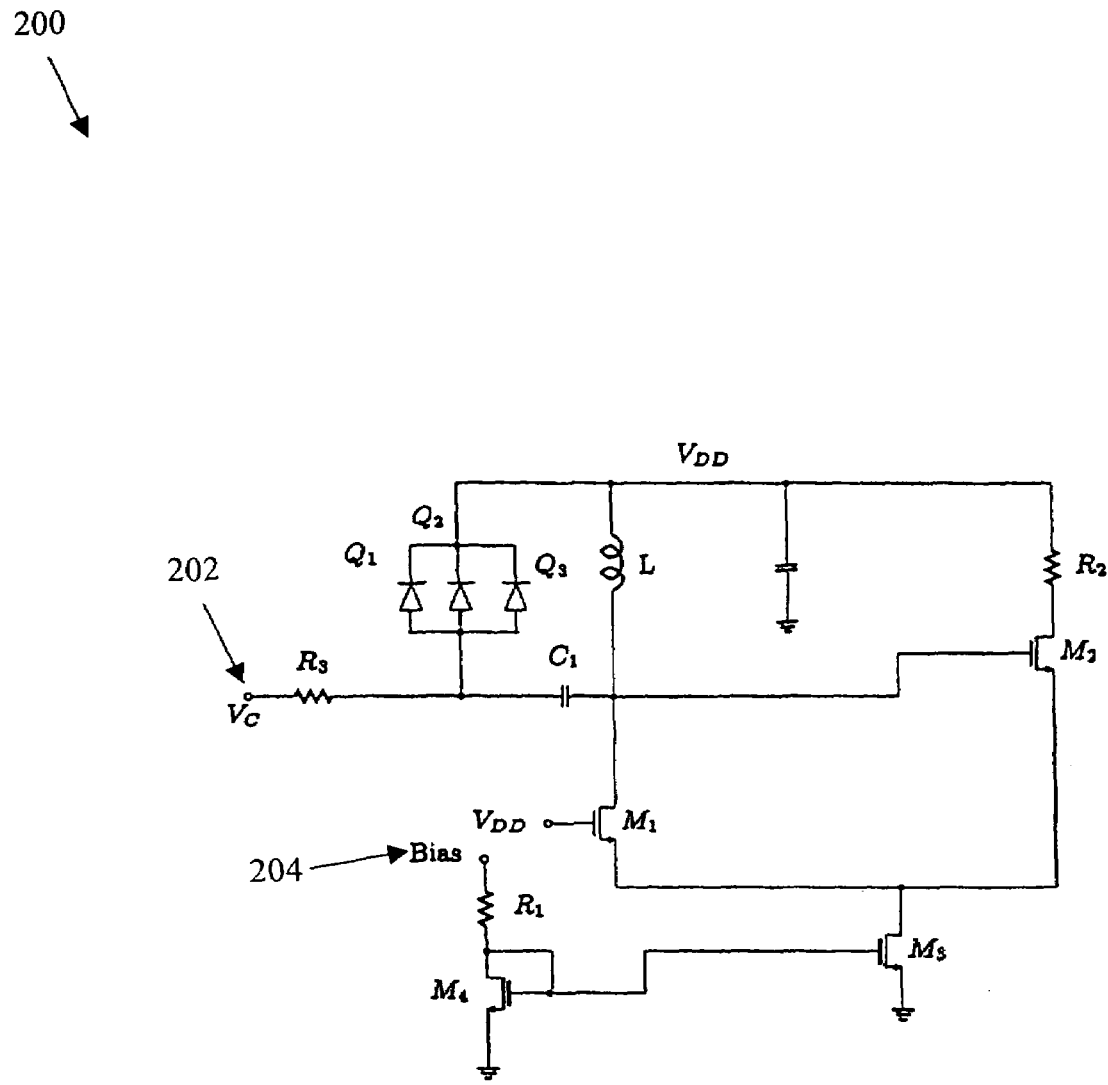
FIG. 2 is a schematic that depicts a VCO in accordance with an embodiment of the invention.

In brief overview, FIG. 2 is schematic that depicts a VCO 200 in accordance with an embodiment of the invention. The VCO 200 includes several FETs (denoted by reference designators beginning with "M") and varactor diodes (denoted by reference designators beginning with "Q"). Also included are impedance elements (see reference designators beginning with "R"), that are resistive at the frequency or frequencies of interest.

The basic design of a VCO is well known, and additional details are available in, e.g., *Radio-Frequency Microelectronic Circuits for Telecommunication Applications*, Y. Papananos, Kluwer Academic Publishers, 1999, p. 188 et seq., and *Analysis and Design of Analog Integrated Circuits*, P. Gray & R. Meyer, John Wiley & Sons, 1984, pp. 628 et seq. Briefly, in VCO 200, output 202 has a frequency that is a function of bias voltage 204. The connection between the gate of FET M2 and drain of FET M1 provides positive feedback to sustain oscillation. FETs M3 and M4 are part of the biasing network, and inductor L and capacitor C1 form a tuned L-C circuit. Varactor diodes Q1 through Q3 are typically bipolar structures, meaning a single-chip VCO may be fabricated using a BiCMOS process.

FETs M1 through M4 are fabricated with channels that include one or more strained channel layers disposed on one or more planarized substrate layers. The channels may be buried below the device surface, or may be surface channels, both as described above. Consequently, the FETs M1 through M4 exhibit improved noise figures, thereby reducing the overall phase noise of the entire VCO 200.

Figure 3:
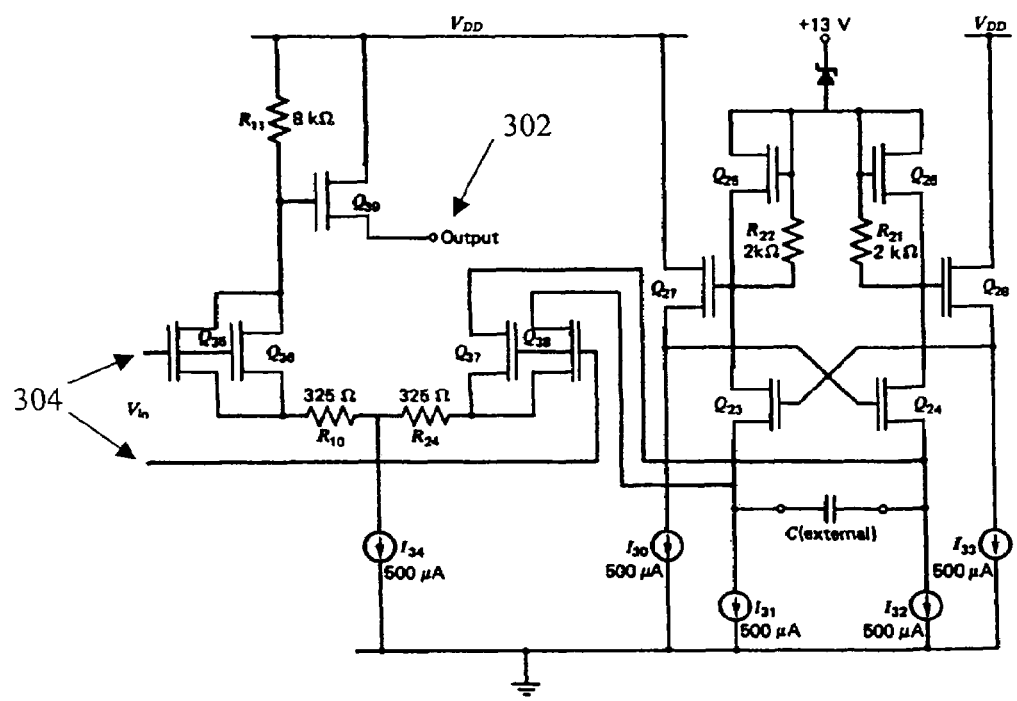
FIG. 3 is a schematic that depicts an alternative VCO design.

Other VCO designs that incorporate FETs having the strained layer on planarized layer structure are possible including, for example, VCO 300 depicted in FIG. 3. Briefly, VCO 300 includes an input stage based on a differential amplifier (generally, FETs Q35 through Q38). The VCO 300 also includes a multivibrator circuit (generally, FETs Q23 and Q24) that has a free running frequency that is inversely proportional to the capacitance C. By using FETs that have one or more strained layers, the overall performance of VCO 300 is enhanced.

Figure 4:
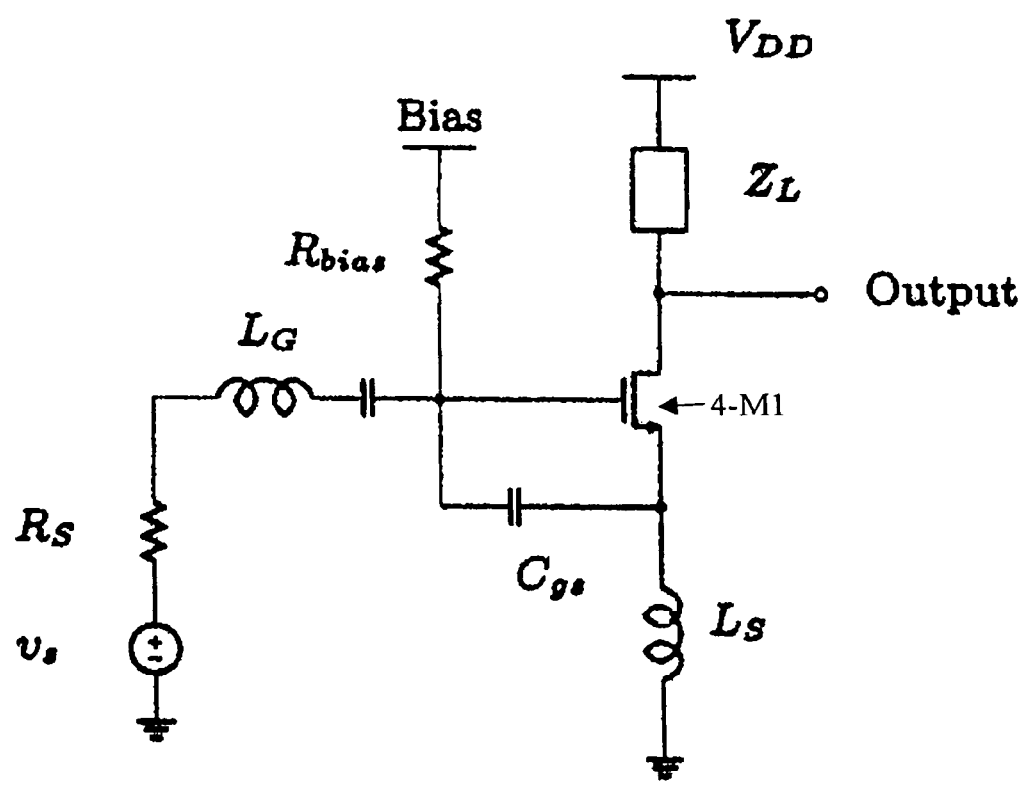
FIG. 4 is a schematic that depicts a LNA in accordance with an embodiment of the invention.

In another embodiment depicted in FIG. 4 in simplified form, an LNA 400 is fabricated using a FET 4-M1 that includes one or more strained channel layers disposed on one or more planarized substrate layers. LNA 400 includes a biasing network Rbias. Inductive elements LG, LS provide input matching. The overall noise figure for the LNA 400 as a function of frequency ("ω") is:

$$NF_{LNA} \approx 1 + \frac{8\omega^2 C_{gs}^2 R_S}{3g_m} \quad \text{(Equation 7)}$$

Accordingly, as the transconductance increases, the noise figure of the LNA 400 decreases. As discussed above in connection with equation (2), FETs fabricated using one or more strained Si layers have, for a given source-drain bias, greater drain current, and therefore greater transconductance, compared to conventional FETs. Consequently, LNA 400 has improved noise performance compared to LNAs fabricated using conventional FETs.

Figure 5:
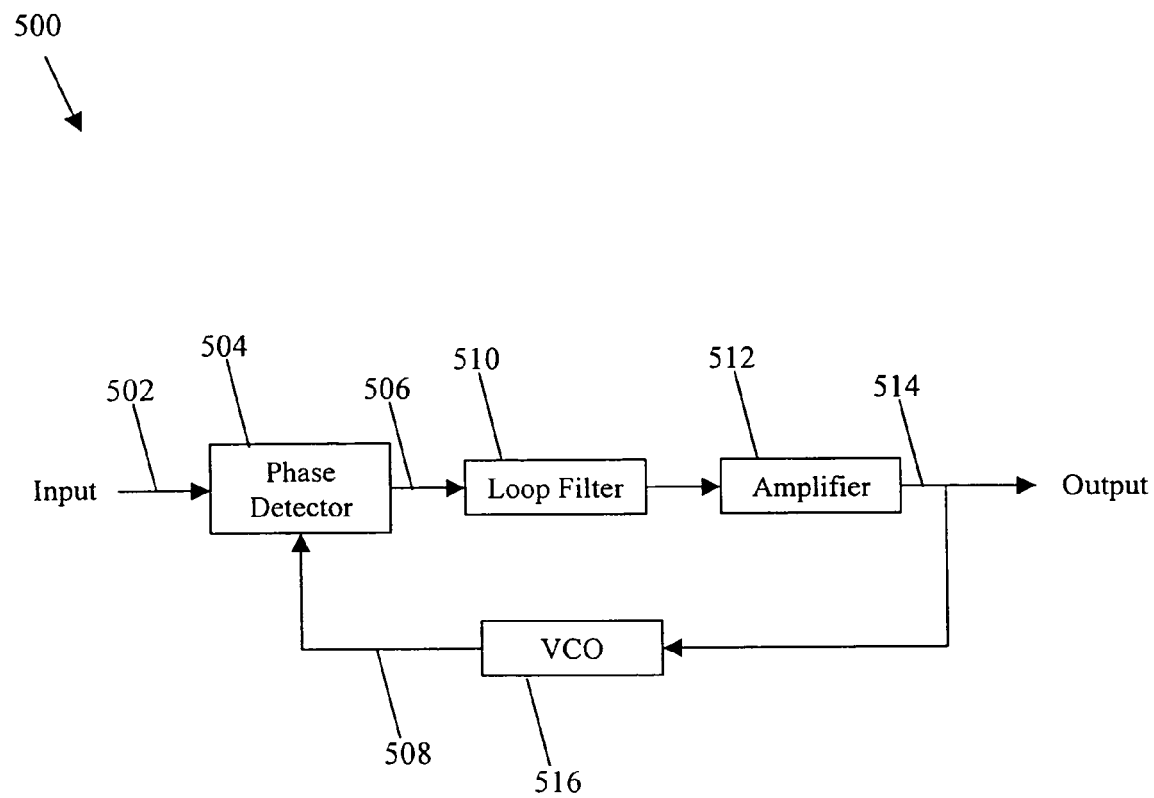
FIG. 5 is a block diagram that depicts a PLL structure.

FIG. 5 is a block diagram that shows a basic PLL 500. As is well known, when the PLL 500 is "locked" on an input signal 502 having a particular frequency, a VCO 516 oscillates at that frequency. A phase detector 504 produces a signal 506 that is proportional to the phase difference between the input signal 502 and the VCO output signal 508. The signal 506 is passed through a loop filter 510, then to amplifier 512, and becomes output signal 514. Output signal 514 is also fed back to control the VCO 516.

In various embodiments of the invention, alternative VCOs 200, 300, depicted in FIGS. 2 and 3, respectively, are used in place of the VCO 516. In other embodiments, LNA 400 is used as the amplifier 512. In each case, the improved performance of VCOs 200, 300, and LNA 400, as described above, results in a PLL 500 that exhibits similar operational performance enhancements (e.g., improved transconductance, noise figure, etc.).

Figure 6:
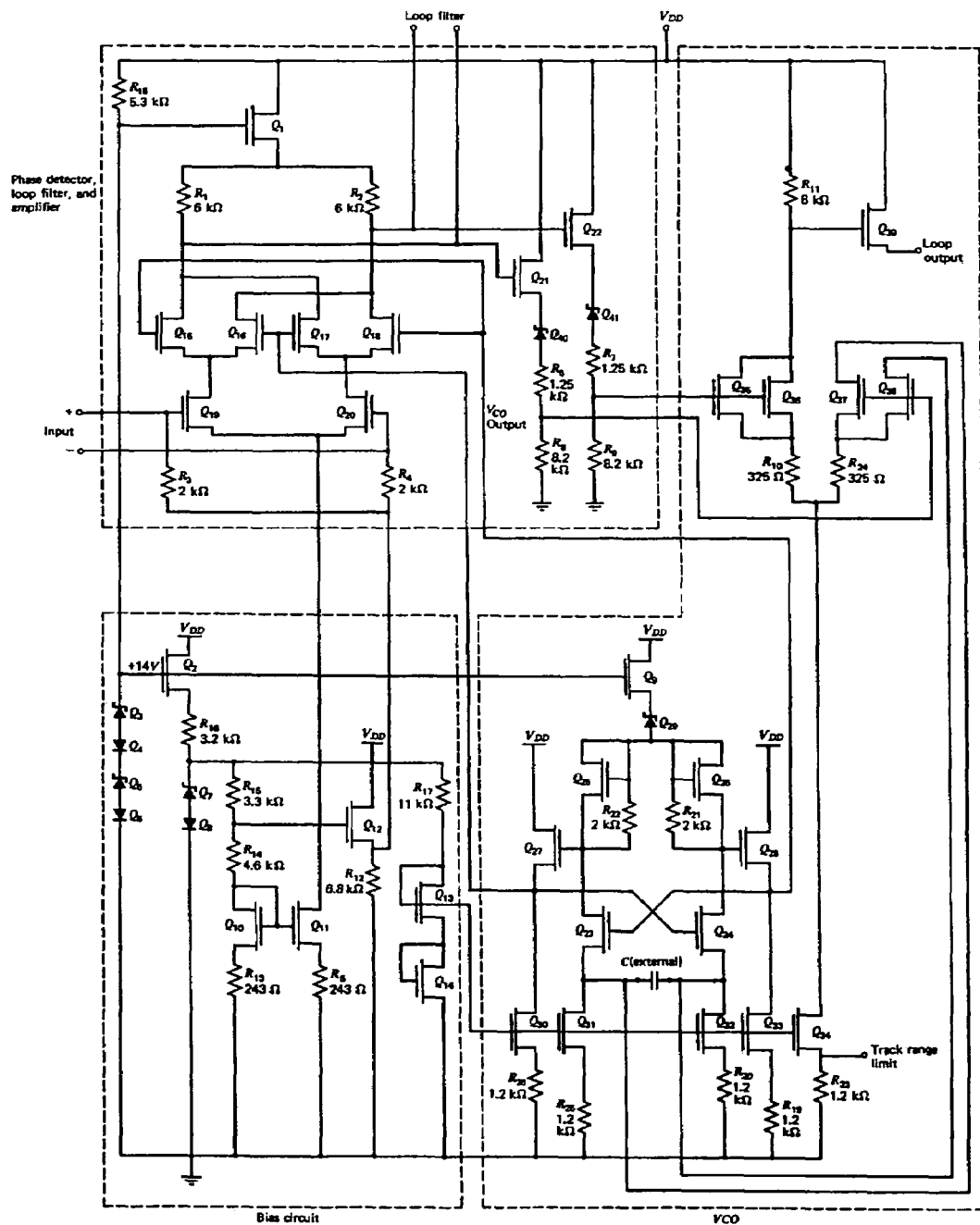
FIG. 6 is a schematic that depicts a PLL in accordance with an embodiment of the invention.

FIG. 6 depicts an alternative PLL design 600. PLL design 600 uses FETs fabricated with channels that include one or more strained channel layers disposed on one or more planarized substrate layers in many, if not all, instances in the PLL 500. This further enhances the overall operational performance of the PLL 500.

From the foregoing, it will be appreciated that the RF circuits provided by the invention afford improved operational performance. Certain operational problems resulting from the limitations inherent in conventional devices used in conventional circuits are largely eliminated.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes which come within the meaning and range of equivalency of the claims are therefore intended to be embraced therein.

What is claimed is:

1. A circuit for processing an RF signal comprising at least one FET to which the RF signal is applied, the at least one FET comprising:

a semiconductor substrate including at least one planarized layer;

a channel region including at least one strained channel layer disposed on the at least one planarized layer thereby defining an interface therebetween, the at least one strained channel layer having a distal zone away from the interface, wherein the substrate, the interface, and the at least one strained channel layer are characterized at least in part by an impurity gradient having a value substantially equal to zero in the distal zone; and a gate electrode.

2. The circuit of claim 1 wherein the substrate comprises Si.

3. The circuit of claim 1 wherein the substrate comprises SiGe.

4. The circuit of claim 1 wherein the at least one planarized layer comprises relaxed SiGe disposed on compositionally graded SiGe.

5. The circuit of claim 1 wherein the at least one planarized layer comprises relaxed SiGe disposed on Si.

6. The circuit of claim 1 wherein the substrate comprises a buried insulating layer.

7. The circuit of claim 1 wherein the at least one strained channel layer comprises Si.

8. The circuit of claim 1 wherein the at least one strained channel layer comprises Ge.

9. The circuit of claim 1 wherein the at least one strained channel layer comprises SiGe.

10. The circuit of claim 1 wherein the channel region comprises n-type conductivity.

11. The circuit of claim 1 wherein the channel region comprises p-type conductivity.

12. The circuit of claim 1 wherein a gate dielectric is disposed substantially between the gate electrode and the channel region.

13. The circuit of claim 1 wherein the FET comprises an interdigitated structure.

14. The circuit of claim 1 wherein an excess carrier supply region is disposed substantially adjacent to the channel region.

15. The circuit of claim 14 wherein the excess carrier supply region is formed at least in part by implantation of at least one impurity.

16. The circuit of claim 1 wherein the circuit comprises a voltage controlled oscillator.

17. The circuit of claim 1 wherein the circuit comprises a low noise amplifier.

18. The circuit of claim 1 wherein the circuit comprises a phase locked loop.

19. The circuit of claim 1 wherein the distal zone comprises at least about fifty Angstroms of the at least one strained channel layer.

* * * * *

UNITED STATES PATENT AND TRADEMARK OFFICE
CERTIFICATE OF CORRECTION

PATENT NO. : 7,709,828 B2  Page 1 of 1
APPLICATION NO. : 11/032413
DATED : May 4, 2010
INVENTOR(S) : Braithwaite et al.

It is certified that error appears in the above-identified patent and that said Letters Patent is hereby corrected as shown below:

On the Title Page, insert Item --Related U.S. Application Data, (60) Provisional application No. 60/324,329, filed on Sept. 24, 2001.--.

Signed and Sealed this

Twentieth Day of July, 2010

David J. Kappos
*Director of the United States Patent and Trademark Office*